(12) United States Patent
Grote et al.

(10) Patent No.: US 12,464,799 B2
(45) Date of Patent: Nov. 4, 2025

(54) SEMICONDUCTOR DEVICE WITH A FIELD PLATE HAVING A RECESSED REGION AND AN OVERHANGING PORTION AND METHOD OF FABRICATION THEREFOR

(71) Applicant: NXP USA, Inc., Austin, TX (US)

(72) Inventors: Bernhard Grote, Phoenix, AZ (US); Jie Hu, Chandler, AZ (US); Philippe Renaud, Chandler, AZ (US); Congyong Zhu, Gilbert, AZ (US); Bruce McRae Green, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 425 days.

(21) Appl. No.: 18/147,197

(22) Filed: Dec. 28, 2022

(65) Prior Publication Data
US 2024/0222443 A1    Jul. 4, 2024

(51) Int. Cl.
| | |
|---|---|
| *H10D 64/00* | (2025.01) |
| *H10D 30/01* | (2025.01) |
| *H10D 30/80* | (2025.01) |
| *H10D 64/01* | (2025.01) |
| *H10D 64/60* | (2025.01) |

(52) U.S. Cl.
CPC ......... *H10D 64/111* (2025.01); *H10D 30/015* (2025.01); *H10D 30/801* (2025.01); *H10D 64/01* (2025.01); *H10D 64/60* (2025.01)

(58) Field of Classification Search
CPC .. H10D 64/111; H10D 30/015; H10D 30/801; H10D 64/01; H10D 64/60; H10D 30/475; H10D 62/149; H10D 62/8503; H10D 64/411; H10D 64/117; H10D 30/47
See application file for complete search history.

(56) References Cited

U.S. PATENT DOCUMENTS

| | | | |
|---|---|---|---|
| 6,867,078 B1 | 3/2005 | Green et al. | |
| 7,592,211 B2 | 9/2009 | Sheppard et al. | |
| 8,049,252 B2 | 11/2011 | Smith et al. | |
| 8,722,547 B2 | 5/2014 | Mani et al. | |
| 9,741,840 B1 * | 8/2017 | Moens | H10D 84/05 |

(Continued)

OTHER PUBLICATIONS

U.S. Appl. No. 17/561,796, filed Dec. 24, 2021, not yet published, 51 pages.

(Continued)

*Primary Examiner* — Mohammad A Rahman
(74) *Attorney, Agent, or Firm* — Sherry W. Gourlay

(57) ABSTRACT

A semiconductor device includes a semiconductor substrate with an upper surface and a channel, source and drain electrodes over the upper surface of the semiconductor substrate, a passivation layer between the source and drain electrodes, a first dielectric layer over the passivation layer, a gate electrode between the source and drain electrodes, and a conductive field plate adjacent to the gate electrode. The passivation layer includes a lower passivation sub-layer and an upper passivation sub-layer over the lower passivation sub-layer. The gate electrode includes a lower portion that extends through the passivation layer. The conductive field plate includes a first portion with a recessed region that extends through the upper passivation sub-layer but does not extend through the lower passivation sub-layer, and an overhanging portion that extends over an upper surface of the first dielectric layer.

26 Claims, 11 Drawing Sheets

(56) References Cited

U.S. PATENT DOCUMENTS 9,847,411 B2 12/2017 Sriram et al.
2016/0086938 A1 3/2016 Kinzer
2019/0326412 A1 10/2019 Behammer
2024/0222442 A1 7/2024 Grote et al.

OTHER PUBLICATIONS

U.S. Appl. No. 17/450,879, filed Oct. 14, 2021, not yet published, 47 pages.
U.S. Appl. No. 17/645,290, filed Dec. 20, 2021, not yet published, 32 pages.
U.S. Appl. No. 17/645,280, filed Dec. 20, 2021, not yet published, 35 pages.
Denninghoff et al.: "Design of High-Aspect-Ratio T-Gates on N-Polar GaN/AlGaN MIS-HEMTs for High fmax", IEEE Electron Device Letters ( vol. 33, Issue: 6, Jun. 2012), pp. 785-787.
Elkashlan et al.: "Analysis of Gate-Metal Resistance in CMOS-Compatible RF GaN HEMTs" IEEE Transactions on Electron Devices, Year: 2020 , vol. 67, Issue: 11, Nov. 11, 2020, 5 pages.
Bothe et al: "Improved X-Band Performance and Reliability of a GaN HEMT With Sunken Source Connected Field Plate Design", IEEE Electron Device Letters ( vol. 43, Issue: 3, Mar. 2022), pp. 354-357.
Kaddeche, M. et al; "Study of Field Plate Effects on AlGaN/GaN HEMTs"; IEEE 2009 Int'l Conf. on Microelectronics, IEEE Xplore; 4 pages (Feb. 2010).
Williams, Kirt R. et al; "Etch Rates for Micromachining Processing—Part II"; IEEE J. of Microelectromechanical Systems, vol. 12, No. 6; 18 pages (Dec. 2003).

\* cited by examiner

SEMICONDUCTOR DEVICE WITH A FIELD PLATE HAVING A RECESSED REGION AND AN OVERHANGING PORTION AND METHOD OF FABRICATION THEREFOR

TECHNICAL FIELD

Embodiments of the subject matter described herein relate generally to semiconductor devices with gate electrodes and field plates and methods for fabricating such devices.

BACKGROUND

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications.

Some GaN transistors include a field plate, which is an electrically-grounded area of metallization that extends over the transistor's gate electrode. The field plate functions to alter the electric field distribution, particularly at the drain-side gate edge. This may result in an increased breakdown voltage and a reduced high-field trapping effect. Accurate alignment of the gate channel and the field plate is important in achieving the necessary device performance for various RF and power applications. Accordingly, in order to meet device performance requirements for a given application, there is a need for GaN devices and methods of fabricating such devices that ensure accurate alignment of the gate channel and the field plate.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments disclosed herein include field effect transistors (FETs), in particular heterojunction field effect transistors (HFET) including high electron mobility transistors (HEMTs) and metal insulator FETs (MISFETS), with fully self-aligned source connected field plates (SFP), gate connected field plates (GFP), and gate channel (GCH). By self-aligning these features of a FET, device-to-device variations in performance (e.g., variations in capacitances, gain, cut-off frequency, output power, and trapping) that may otherwise occur due to misalignment may be avoided.

Further, the FET embodiments disclosed herein include a SFP with a portion that is recessed with respect to the GFPs, which may result in a beneficial reduction in gate-drain capacitance, $C_{GD}$. More particularly, and according to the various embodiments, the recessed portion of the SFP is "self aligned" to the GCH. Further, in at least one embodiment, the SFP includes two SFP alignment structures and a third SFP element formed from a distinct metal layer. The third SFP element includes an overhanging portion, which may have the beneficial effect of reducing the electric field around the SFP alignment structures to enhance reliability and the dielectric voltage withstand capability.

Figure 1:
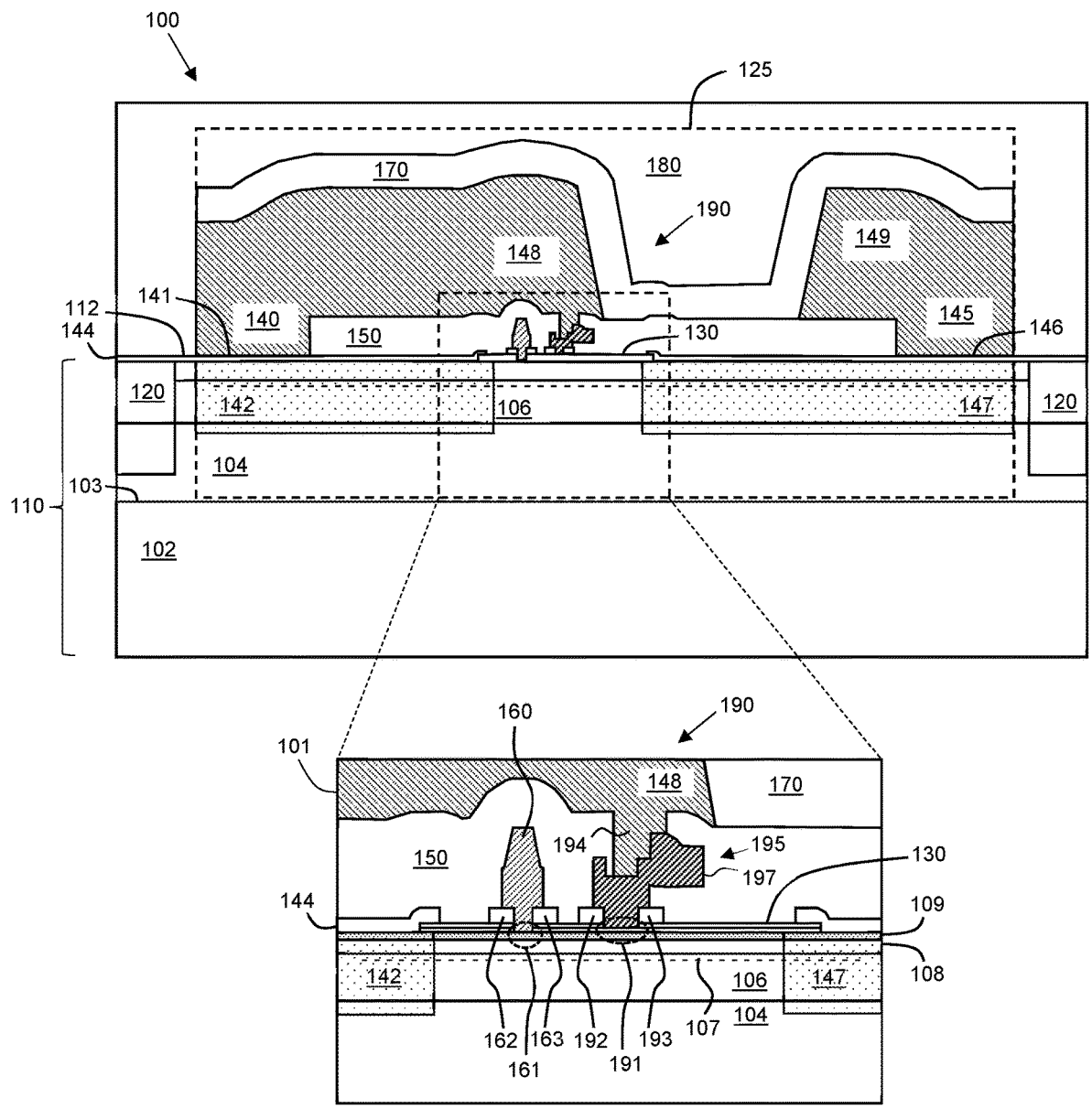
FIG. 1 is a cross-sectional, side view of an exemplary heterojunction field effect transistor (HFET), in accordance with an embodiment.

FIG. 1 is a cross-sectional, side view of an exemplary GaN heterojunction field effect transistor (HFET) device 100, in accordance with an embodiment. The upper image in FIG. 1 shows a comprehensive view of the GaN HFET device 100. In addition, for enhanced understanding, an enlarged view of a portion 101 of the GaN HFET device 100 is shown below the comprehensive view of device 100. Portion 101 corresponds to an embodiment of a transistor structure described in detail later in conjunction with FIG. 3K.

The GaN HFET device 100 includes a semiconductor substrate 110, one or more isolation regions 120 and an active region 125. The active region is defined as the portion of device 100 that is located between the isolation regions 120.

Within the active region 125, HFET device 100 includes a source electrode 140 disposed over a source contact 141 and source implant 142, a drain electrode 145 disposed over a drain contact 146 and drain implant 147, a gate electrode 160, and gate connected field plate alignment structures 162, 163 ("gate alignment structures").

In addition, according to an embodiment, HFET device 100 also includes a source connected field plate 190 (SFP) that includes first and second SFP alignment structures 192, 193 ("field plate alignment structures") and a third SFP element 195, which is formed from a distinct metal layer, and which fills a recess between the SFP alignment structures 192, 193 to provide a "recessed" SFP region 191. More particularly, and as will be described in detail below, the SFP region 191 is recessed with respect to the GFP alignment structures 162, 163 and the SFP alignment structures 192, 193, while still being self-aligned with the gate channel 161 (i.e., the portion of the gate electrode 160 that contacts the upper surface 112 of the semiconductor substrate 110). According to an embodiment, the self-aligned and recessed SFP region 191 is made possible with the inclusion, in device 100, of the first and second SFP alignment structures 192, 193, the third SFP element 195, and a surface passivation layer 130 that is formed from multiple (e.g., 2-3 or more) different dielectric layers (referred to herein as "passivation sub-layers"), as will be described in detail later. The recessed SFP region 191 may result in reduced gate drain capacitance, $C_{GD}$, when compared with devices that lack this feature. The lower gate drain capacitance, $C_{GD}$, in turn, may result in increased gain for the device 100. In addition, the third SFP element 195 has an overhanging portion 197 that is separated from the surface of the substrate 110 through a portion of the below-described dielectric layers 150 plus a full thickness of the surface passivation layer 130. This feature is configured to reduce the electric field around the first and second SFP alignment structures 192, 193 during operation of device 100, while increasing the dielectric voltage withstand capability of the device 100, as mentioned above.

The source electrode 140, the drain electrode 145, the gate electrode 160, the GFP alignment structures 162, 163, the SFP alignment structures 192, 193, the third SFP element 195, and the surface passivation layer 130 are disposed over an upper surface 112 of the semiconductor substrate 110. Conversely, the source implant 142 and the drain implant 147 represent regions of the semiconductor substrate 110 into which source and drain dopants have been implanted. In an embodiment, GaN HFET device 100 may be configured as a transistor finger wherein the source electrode 140, the drain electrode 145, the gate electrode 160, and the field plate 190 may be configured as elongated elements forming a gate finger. To build up a high power device, multiple instances of GaN HFET device 100 may be implemented in parallel with the drain electrodes 145 all coupled together, the source electrodes 140 all coupled together, and the gate electrodes 160 all coupled together.

In an embodiment, the semiconductor substrate 110 may include a host substrate 102, a buffer layer 104 disposed over the host substrate 102, a channel layer 106 disposed over the buffer layer 104, and a barrier layer 108 disposed over the channel layer 106. In some embodiments, a cap layer 109 is disposed over the channel layer 106, and the cap layer 109 defines the upper surface 112 of the substrate 110. In other embodiments, the cap layer 109 may be excluded, and the barrier layer 108 may define the upper surface 112 of the substrate 110. In the drawings, the cap layer 109 is shaded for enhanced distinguishability from the below-described surface passivation layer 130.

In an embodiment, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface 103 of the host substrate 102 between the buffer layer 104 and the host substrate 102. In an embodiment, the nucleation layer may include AlN. The buffer layer 104 may include a number of group III-N semiconductor layers and is supported by the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 may be grown epitaxially over the host substrate 102. The buffer layer 104 may include at least one AlGaN mixed crystal layer having a composition denoted by $Al_XGa_{1-X}N$ with an aluminum mole fraction, X, that can take on values between 0 and 1. The total thickness of the buffer layer 104, including all of its constituent layers, may be between about 200 angstroms and about 100,000 angstroms, although other thicknesses may be used. A limiting X value of 0 yields pure GaN while a value of 1 yields pure aluminum nitride (AlN). An embodiment may include a buffer layer 104 disposed over the host substrate 102 and nucleation layer (not shown). The buffer layer 104 may include additional $Al_XGa_{1-X}N$ layers. The thickness of the additional $Al_XGa_{1-X}N$ layer(s) may be between about 200 angstroms and about 50,000 angstroms, although other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers, where the one or more GaN layers are intentionally doped with dopants that may include iron (Fe), chromium (Cr), carbon (C) or other suitable dopants that render the buffer layer 104 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2,000 angstroms, although other thicknesses may be used.

In an embodiment, a channel layer 106 may be formed over the buffer layer 104. The channel layer 106 may include one or more group III-N semiconductor layers and may be supported by the buffer layer 104. The channel layer 106 may include an $Al_XGa_{1-X}N$ layer where X takes on values between 0 and 1. In an embodiment, the channel layer 106 is configured as GaN (X=0), although other values of X may be used without departing from the scope of the inventive subject matter. The thickness of the channel layer 106 may be between about 50 angstroms and about 10,000 angstroms, although other thicknesses may be used. The channel layer 106 may be NID or, alternatively, may include Si, germanium (Ge), C, Fe, Cr, or other suitable dopants. The dopant concentration may be between about $10^{15}$ cm$^{-3}$ and about $10^{19}$ cm$^{-3}$, although other higher or lower concentrations may be used. In other embodiments, the channel layer 106 may include NID or doped $In_YGa_{1-Y}N$, where Y, the indium mole fraction, may take a value between 0 and 1.

A barrier layer 108 may be formed over the channel layer 106, in accordance with an embodiment. The barrier layer 108 may include one or more group III-N semiconductor layers and is supported by the channel layer 106. In some embodiments, the barrier layer 108 may have a larger bandgap and larger spontaneous polarization than the channel layer 106, and, when the barrier layer 108 is in direct contact with the channel layer 106, a channel 107 is created in the form of a two-dimensional electron gas (2-DEG) within the channel layer 106 near the interface between the channel layer 106 and the barrier layer 108. In addition, strain between the barrier layer 108 and channel layer 106 may cause additional piezoelectric charge to be introduced into the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms, although other thicknesses may be used. The barrier layer 108 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG. In other embodiments, the barrier layer 108 may include indium aluminum nitride (InAlN) layers, denoted $In_yGa_{1-y}N$, where Y, the indium mole fraction may take a value between about 0.1 and about 0.2, although other values of Y may be used. In the case of an InAlN barrier, the thickness of the barrier layer 108 may be between about 30 angstroms and about 1000 angstroms, although other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$, although other higher or lower concentrations may be used.

In an embodiment illustrated in FIG. 1, a cap layer 109 may be formed over the barrier layer 108. The cap layer 109 may present a stable surface for the semiconductor substrate 110 and may protect the surface of the semiconductor substrate 110 from chemical and environmental exposure incident to wafer processing. The cap layer 109 may include one or more group III-N semiconductor layers and is supported by the barrier layer 108. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ cm$^{-3}$ and $10^{19}$ cm$^{-3}$, although other higher or lower concentrations may be used.

Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary, and that the function and operation of the various layers may be combined and may change depending on the materials used in any specific embodiment. For example, in some embodiments, the cap layer 109 may be omitted. In such embodiments, the barrier layer 108 defines the upper surface 112 of the substrate 110.

In other embodiments using N-polar materials, the channel layer 106 may be disposed over the barrier layer 108 to create a 2-DEG and channel 107 directly beneath the cap layer 109 and the gate electrode 160. Still further embodiments may include semiconductor layers formed from materials including GaAs, gallium oxide ($Ga_2O_3$) aluminum gallium arsenide (AlGaAs), indium gallium arsenide (InGaAs), and aluminum indium arsenide (AlInAs) to form the semiconductor substrate 110.

One or more isolation regions 120 may be formed in the semiconductor substrate 110 to define an active region 125 above and along the upper surface 103 of the host substrate 102, according to an embodiment. The isolation regions 120 may be formed via an implantation procedure configured to damage the epitaxial and/or other semiconductor layers to create high resistivity regions of the semiconductor substrate 110 (i.e., rendering the semiconductor substrate 110 high resistivity or semi-insulating in those high resistivity regions), while leaving the crystal structure intact in the active region 125. In other embodiments, the isolation regions 120 may be formed by removing one or more of the epitaxial and/or other semiconductor layers of the semiconductor substrate 110, rendering the remaining layers of the semiconductor substrate 110 semi-insulating and leaving behind active region "mesas" surrounded by high resistivity or semi-insulating isolation regions (not shown). In still other embodiments, the isolation regions 120 may be formed by removing one or more of the epitaxial and/or other semiconductor layers of the semiconductor substrate 110, and then using ion implantation to damage and further enhance the semi-insulating properties of the remaining layers of the semiconductor substrate 110 and leaving behind active region "mesas" surrounded by high resistivity or semi-insulating isolation regions 120 that have been implanted (not shown).

In an embodiment, a surface passivation layer 130 is formed over the active region 125 and isolation regions 120. In various embodiments, the surface passivation layer 130 is formed from multiple passivation sub-layers (e.g., layers 131, 133, FIG. 3), each of which is formed from a different dielectric material. The passivation sub-layers have different etch properties which, as will be described in more detail later, enable the formation of a recessed SFP region 191. For example, the various materials from which the passivation sub-layers may be formed include, but are not limited to, silicon dioxide ($SiO_2$), silicon nitride ($Si_3N_4$ or other stoichiometries), silicon oxynitride (SiON in various stoichiometries), aluminum oxide ($Al_2O_3$), aluminum nitride (AlN), and hafnium oxide ($HfO_2$), though other substantially insulating materials may be used.

In an embodiment, the source electrode 140 and the drain electrode 145 are formed over source and drain implants 142, 147, which are formed in semiconductor substrate 110 in the active region 125. In some embodiments, ion implantation may be used to form the source and drain implants 142, 147, and these implants 142, 147 extend between opposite ends of the channel 107 and the upper surface 112 of the semiconductor substrate 110.

Source and drain contacts 141, 146 are formed on the upper surface 112 of the substrate over the source and drain implants 142, 147 prior to forming the source and drain electrodes 140, 145, in various embodiments. For example, the source and drain contacts 141, 146 may be formed on the upper surface 112 through openings in the surface passivation layer 130. The source and drain contacts 141, 146 may contact the cap layer 109, in some embodiments, or may contact the barrier layer 108 if the cap layer 109 is excluded. In some embodiments, the source and drain contacts 141, 146 may be recessed into the semiconductor substrate 110.

In an embodiment, the source and drain contacts 141, 146 are formed from an etchable, patterned conductive layer 144, which may include one or more layers of titanium (Ti), titanium tungsten (TiW), titanium aluminum (TiAl), titanium-tungsten nitride (TiWN) or other materials that are suitable for forming an Ohmic contact in conjunction with the source and drain implants 142, 147. In conjunction with the source and drain implants 142, 147, conductive layer 144 forms an Ohmic contact with the channel 107. As will be described in more detail in conjunction with FIG. 3, the GFP alignment structures 162, 163 and SFP alignment structures 192, 193 may be formed from the same conductive layer 144 as the source and drain contacts 141, 146. In other embodiments, the Ohmic drain and source contacts 141, 146 may be formed using a different conductive layer of a suitable material.

The source and drain electrodes 140, 145 may be formed from a stack of multiple conductive layers, and the portions of the conductive stack corresponding to the source and drain electrodes 140, 145 may be referred to as source metallization and drain metallization, respectively. In some embodiments, the multi-layer stack used to form the source electrode 140 and the drain electrode 145 may include, for example, one or more layers of Ti, TiW, TiAl, TiWN, gold (Au), Al, molybdenum (Mo), nickel (Ni), Si, Ge, platinum (Pt), tantalum (Ta), combinations of these materials, or other suitable materials.

Additional dielectric layers 150 (e.g., layers 151, 154, FIG. 3I) are disposed over the surface passivation layer 130, according to various embodiments. For example, the additional dielectric layers 150 may be formed from one or more suitable materials including silicon dioxide ($SiO_2$), tetraethyl orthosilicate (TEOS), organo-silicate glass, porous silicon dioxide, silicon nitride ($Si_3N_4$), silicon oxynitride (SiON), aluminum oxide ($Al_2O_3$), aluminum nitride (AlN), and hafnium oxide ($HfO_2$), though other substantially insulating materials may be used. In an embodiment, the additional dielectric layers 150 may be formed from low-k dielectric material(s). As used herein, the term, "low-k dielectric material" refers to a dielectric material having a dielectric constant below about 5.0. In an embodiment, the dielectric constant of the surface passivation layer 130 may exceed the dielectric constant of the additional dielectric layers 150. In other words, the surface passivation layer 130 may be formed from high-k dielectric materials. As used herein, the term, "high-k dielectric material" refers to a dielectric material having a dielectric constant above about 5.0. The lower dielectric constant for the additional dielectric layers 150, which as mentioned above may be realized using low-k dielectric material(s), may reduce the parasitic capacitance between the gate electrode 160 and the source metallization 148 and field plate structure 190, and between the drain electrode 145 and field plate 190, in some embodiments.

In an embodiment, the gate electrode 160 may be formed over the semiconductor substrate 110 between the source electrode 140 and the drain electrode 145 in the active region 125. As will be described in detail in conjunction with FIG. 3, to form the gate electrode 160, an opening may be formed in the surface passivation layer 130 between the source electrode 140 and the drain electrode 145 to enable the gate electrode 160 to contact the upper surface 112 of the semiconductor substrate 110. The area of contact between the gate electrode 160 and the upper surface 112 of the substrate 110 is referred to herein as the "gate channel" 161, and a Schottky gate is formed in the gate channel 161. In an embodiment, the gate electrode 160 may be characterized by a gate length where the gate electrode 160 contacts the substrate surface 112, and the gate length may be between about 0.05 microns and about 1 micron, in various embodiments. In other embodiments, the gate length may be between about 0.02 microns and about 5 microns, although other suitable dimensions may be used.

Essentially, the gate electrode 160 is configured to control current flow through the channel 107 (i.e., between the source and drain contacts 142, 147) during operation of the device 100. More specifically, changes to the electric potential applied to the gate electrode 160 may shift the quasi Fermi level for the barrier layer 108 with respect to the quasi Fermi level for the channel layer 106 to thereby modulate the electron concentration in the channel 107 under the gate electrode 160. For a low-loss, Schottky gate electrode 160, one or more Schottky materials such as Ni, palladium (Pd), Pt, iridium (Ir), or Copper (Cu), may be combined with one or more low stress conductive materials such as Au, Al, Cu, poly Si, or other suitable material(s) in a metal stack to form the gate electrode 160, according to an embodiment.

Without departing from the scope of the inventive subject matter, numerous other embodiments may be realized. The exemplary embodiment of FIG. 1 depicts the gate electrode 160 as being disposed over the semiconductor substrate 110. In other embodiments (not shown), the gate electrode 160 may be recessed through the cap layer 109 and extend partially into the barrier layer 108, increasing the electrical coupling of the gate electrode 160 to the channel 107 through the barrier layer 108. In other embodiments (not shown), the cap layer 109 may be omitted and the gate electrode 160 may contact the barrier layer 108 directly. In still other embodiments, the gate electrode 160 may be disposed over a gate insulator (e.g., gate insulator 431, FIG. 3L) that may be formed between the gate electrode 160 and the semiconductor substrate 110 to form a metal-insulator semiconductor field effect transistor (MISFET) device. An example embodiment that includes a MISFET is described later in conjunction with FIG. 4.

As discussed previously, a conductive source-connected field plate 190 (SFP) is formed over the additional dielectric layers 150, adjacent the gate electrode 160, and between the gate electrode 160 and the drain electrode 145. As used herein, the term "adjacent to" means next to, in the horizontal direction in FIGS. 1 and 3. In an embodiment, the SFP 190 may include source-side and drain-side (or first and second) SFP alignment structures 192, 193, respectively, on opposite sides of the recessed SFP region 191. In addition, the SFP 190 includes a third SFP element 195 between and above the SFP alignment structures 192, 193, and the third SFP element 195 includes a recessed SFP region 191 in contact with a portion of the surface passivation layer 130. During operation of the device 100, the field plate 190 may be configured to reduce the electric field and feedback capacitance, $C_{GD}$, between the gate electrode 160 and the drain electrode 145. According to an embodiment, a conductive field plate via 194 electrically connects the third SFP element 195 (and thus the SFP region 191) and the SFP alignment structures 192, 193 to source metallization 148, which extends between an upper end of the conductive field plate via 194 over the gate 160 to the source electrode 140. In various embodiments, the field plate 190 may be formed using one or more conductive layers that are also used to form the source and drain electrodes 140, 145. For example, the field plate 190 may be formed from Ti, Au, Al, Mo, Ni, Si, Ge, Pt. Ta, combinations of these materials, or other suitable materials. In other embodiments, the one or more conductive layers used to form the field plate 190 may include TiW, TiAl, or TiWN.

In various embodiments, additional dielectric and metal layers may be formed over and adjacent to the GaN HFET device 100. For example, in FIG. 1, final passivation layers 170, 180 may be formed over dielectric layers 150 and the metallization for the source and drain electrodes 140, 145. Still other additional dielectric and metal layers may include additional passivation layers and interconnect metallization, and additional active devices (e.g. additional GaN HFETs) and additional circuitry, also may be formed along with device 100.

Figure 2:
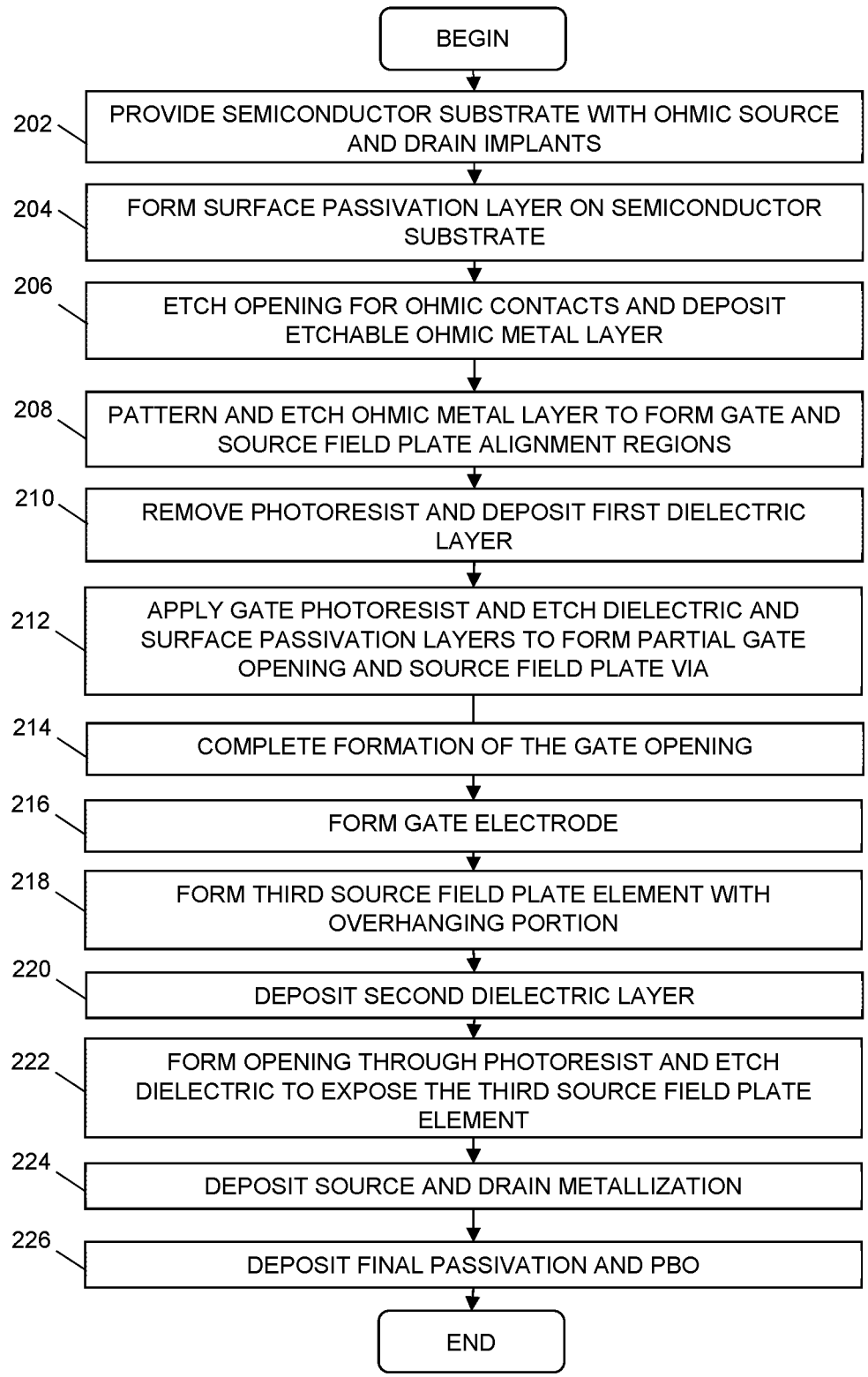
FIG. 2 is a process flow diagram describing embodiments of methods for fabricating the heterojunction field effect transistor (HFET) devices of FIGS. 1 and 3.

FIG. 2 is a process flow diagram describing embodiments of methods for fabricating the GaN HFET device 100 of FIG. 1. For enhanced understanding, FIG. 2 should be viewed in conjunction with FIGS. 3A-3K (collectively FIG. 3), where each of FIGS. 3A-3K depicts a process step corresponding to the fabrication of GaN HFET device 100. It should be noted here that FIG. 3 only depicts a portion 101 of a GaN HFET device 100 in which the gate and field plate are formed so that the important and enlarged details of the various fabrication steps can be easily seen. More specifically, FIG. 3, which includes FIGS. 3A-K includes cross-sectional, side views of an embodiment of portion 101 of GaN HFET device 100 during a sequence of fabrication steps. It should be noted that portion 101 in FIG. 3 corresponds to portion 101 of FIG. 1.

Referring initially to FIGS. 1 and 2, fabrication of GaN HFET device 100 begins, in block 202, by providing a semiconductor substrate 110 in which Ohmic source and drain implants (e.g., source and drain implants 142, 147) have already been formed. In at least one embodiment, providing the semiconductor substrate 110 may include providing a host substrate 102 and forming number of semiconductor layers on or over the host substrate 102. For example, the host substrate 102 may include SiC, or may include other materials such as sapphire, Si, GaN, AlN, diamond, poly-SiC, silicon on insulator, GaAs, InP, or other substantially insulating or high resistivity materials. Forming the semiconductor layers may include forming a nucleation layer (not shown) on or over an upper surface 103 of the host substrate 102, forming a buffer layer 104 on or over the nucleation layer, forming a channel layer 106 on or over the buffer layer 104, forming a barrier layer 108 on or over the channel layer 106, and optionally forming a cap layer 109 on or over the barrier layer 108. As discussed previously, embodiments of the buffer layer 104, the channel layer 106, the barrier layer 108, and the cap layer 109 may include materials selected from AlN, GaN, AlGaN, InAlN, InGaN, or other suitable materials. The semiconductor layers 104, 106, 108, and 109 may be grown using one of metal-organo chemical vapor deposition (MOCVD), molecular beam epitaxy (MBE), hydride-vapor phase epitaxy (HVPE) or a combination of these techniques, although other suitable techniques may alternatively be used.

Embodiments of the method may optionally include forming doped (e.g., ion-implanted) source and drain regions 142 and 147 (FIG. 1). Forming source and drain regions 142 and 147 may include forming a sacrificial dielectric layer (e.g., selected from $Si_3N_4$, $Al_2O_3$, $SiO_2$, AlN, and $HfO_2$) on or over the semiconductor substrate 110. An implant mask may then be formed on the sacrificial dielectric layer, and a dopant species (e.g., selected from one or more of Si, Ge, O, or other suitable n-type dopant(s)) is implanted through openings in the implant mask into the semiconductor substrate 110 to form source and drain implant regions within the semiconductor substrate. The implant mask may be removed (e.g., using one or more conventional wet chemical and plasma ashing technique(s)) before activating the dopant species in the implant regions to complete the formation of the source and drain regions 142 and 147 within the semiconductor substrate 110. The implant regions then may be activated (e.g., by annealing the semiconductor substrate 110) to form the source and drain regions 142, 147, and the sacrificial dielectric layer is removed (e.g., using wet or dry etching).

Figure 3A:
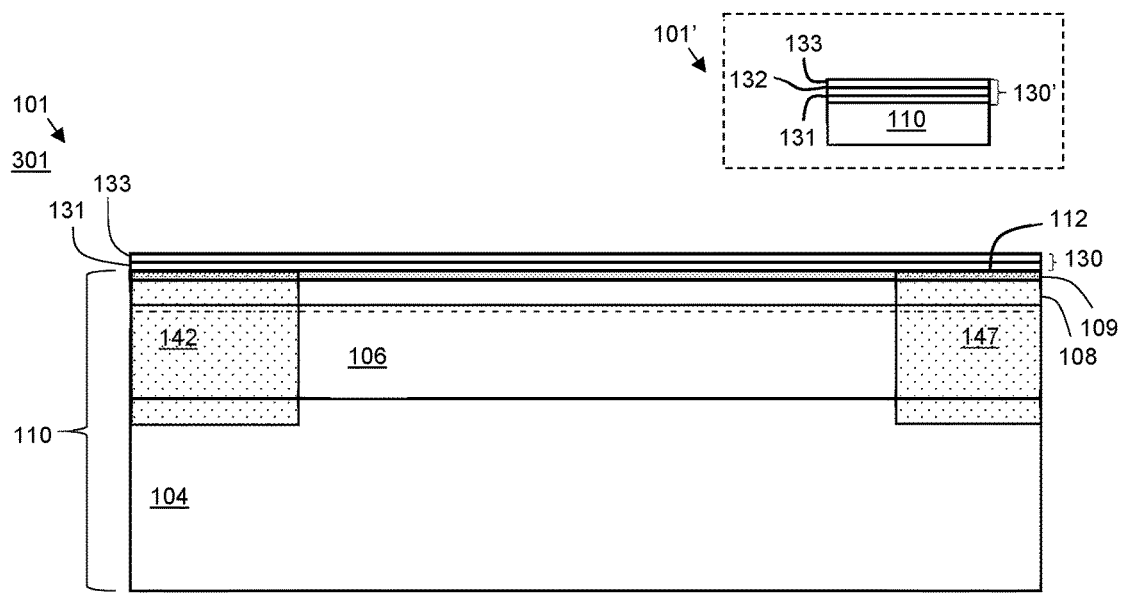
FIGS. 3A, 3B, 3C, 3D, 3E, 3F, 3G, 3H, 3I, 3J, and 3K (collectively FIG. 3) are cross-sectional, side views of embodiments of an HFET device during a sequence of fabrication steps, according to a fabrication embodiment.

Referring now to FIGS. 2 and 3A, in block 204 and fabrication stage 301 (FIG. 3A), a surface passivation layer 130 is formed on the upper surface 112 of the semiconductor substrate 110. According to an embodiment, the surface passivation layer 130 includes at least two passivation sub-layers 131, 133, which may be referred to as lower and upper passivation sub-layers 131, 133, respectively. In some embodiments, such as that shown in FIG. 3A, surface passivation layer 130 includes only two passivation sub-layers 131, 133. In an alternate embodiment, as shown in callout 101' of FIG. 3A, an alternate embodiment of surface passivation layer 130' may include a third, intermediate passivation sub-layer 132 (e.g., a thin $SiO_2$ layer having a thickness in a range of 10 to 200 angstroms) sandwiched in-between the lower and upper passivation sub-layers 131, 133. According to an embodiment, the surface passivation layer 130 may have a total thickness (including the thicknesses of all sub-layers) of between about 200 angstroms and about 1000 angstroms, although other thicknesses may be used.

The lower and upper passivation sub-layers 131, 133 are formed from different dielectric materials that enable etch selectivity (i.e., layers 131 and 133 are etchable using different etch chemistries). In particular, as described below, the lower passivation sub-layer 131 will function as an etch stop when etching through the upper passivation sub-layer 133 using a first etch chemistry. In other words, one or more etch chemistries that are used, as described later, to etch the upper passivation sub-layer 133 have a high etch selectivity between the materials of the upper and lower passivation sub-layers 133, 131. As is understood by those of skill in the art, etch selectivity is the ratio of etch rates between materials. In the present case, the etch selectivity for an etchant used to etch the upper passivation sub-layer 133 may be defined as the ratio between the etch rate for the material of the upper passivation sub-layer 133 ("etch rate 133") to the etch rate for the material of the lower passivation sub-layer 131 ("etch rate 131") (i.e., the etch selectivity for the etchant used to etch the upper passivation sub-layer 133 equals etch rate 133/etch rate 131). According to various embodiments, the materials of layers 131, 133 are high-k dielectric materials to provide high dielectric voltage withstand capability for a low equivalent oxide thickness.

The lower passivation sub-layer 131 is formed directly on the upper surface 112 of the semiconductor substrate 110 (e.g., on cap layer 109, if included, or on barrier layer 108 if cap layer 109 is excluded). According to various embodiments, the lower passivation sub-layer 131 may have a thickness in a range of about 100 angstroms to about 500 angstroms, although layer 131 may be thinner or thicker, as well. In some embodiments, the portion of the lower passivation sub-layer 131 that is present between the recessed SFP region 191 of the SFP 190 and the upper surface 112 of the substrate 110 has a thickness that essentially is the entire thickness of the lower passivation sub-layer 131. In other embodiments, a relatively small depth (e.g., up to 20 percent) of the upper surface of the lower passivation sub-layer 131 may be etched away during the processes of etching dielectric material of the upper passivation sub-layer 133, and accordingly, the portion of the lower passivation sub-layer 131 that is present between the recessed SFP region 191 of the SFP 190 and the upper surface 112 of the substrate 110 may have a thickness that is less than the entire thickness of the lower passivation sub-layer 131 (e.g., up to 20 percent less). Either way, the thickness of the lower passivation sub-layer 131 at least partially determines the dielectric thickness under the recessed SFP region 191 of the field plate 190 (FIGS. 1 and 3H).

According to an embodiment, the lower passivation sub-layer 131 is formed from a dielectric material that has a very low or negligible etch rate when exposed to the etch chemistry that will be subsequently used to etch the upper passivation sub-layer 133 (e.g., as described later in conjunction with FIG. 3E). For example, and according to some embodiments, the lower passivation sub-layer 131 may be formed from silicon nitride ($Si_3N_4$, including silicon-rich or silicon-poor compositions thereof) using low pressure chemical vapor deposition (LPCVD), although layer 131 alternatively may be formed from another dielectric material and/or using a different deposition method (e.g., atomic layer deposition (ALD), sputtering, physical vapor deposition (PVD), plasma-enhanced chemical vapor deposition (PECVD), metal organic CVD (MOCVD), molecular beam epitaxy (MBE), inductively coupled plasma (ICP) deposition, electron cyclotron resonance (ECR) deposition, or other suitable techniques).

According to an embodiment, the upper passivation sub-layer 133 is formed directly on the lower passivation sub-layer 131. According to various embodiments, the upper passivation sub-layer 133 may have a thickness in a range of about 100 angstroms to about 1000 angstroms, although layer 133 may be thinner or thicker, as well. As mentioned previously, in some embodiments, an intermediate passivation sub-layer 132 (e.g., a thin $SiO_2$ layer, FIG. 3A) may be deposited on the lower passivation sub-layer 131 prior to depositing the upper passivation sub-layer 133.

According to an embodiment, and as indicated above, the upper passivation sub-layer 133 is formed from a dielectric material that has a very high etch rate, in comparison with the lower passivation sub-layer 131, when exposed to the etch chemistry that will be subsequently used to etch the upper passivation sub-layer 133 (e.g., as described later in conjunction with block 218 and FIG. 3E). For example, and according to some embodiments, the upper passivation sub-layer 133 may be formed from aluminum oxide ($Al_2O_3$) or aluminum nitride (AlN) using sputtering, ALD or plasma enhanced atomic layer deposition (PEALD), although layer 133 alternatively may be formed from another dielectric material (e.g., $HfO_2$) and/or using a different deposition method (e.g., PVD, PECVD, MOCVD, MBE, ICP deposition, ECR deposition, or other suitable techniques).

Figure 3B:
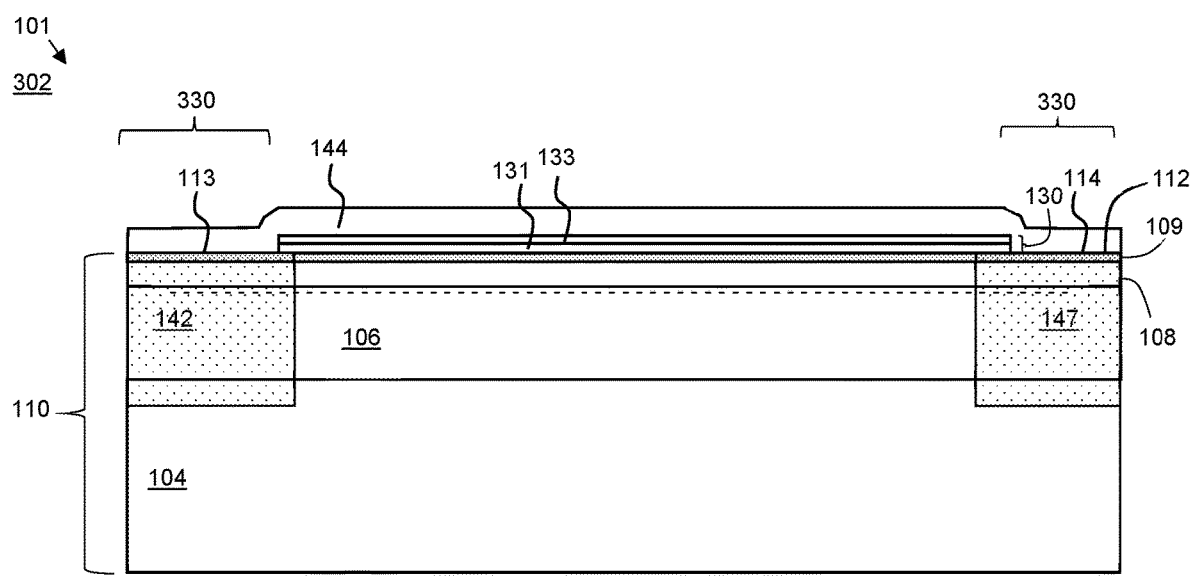

Referring now to FIGS. 1, 2, and 3B, in block 206 and fabrication stage 302 (FIG. 3B), openings 330 for the source and drain Ohmic contacts (e.g., contacts 141, 146, FIG. 1, not shown in FIG. 3) are formed in the surface passivation layer 130 over the source and drain implants 142, 147 (FIG. 1) using sequential selective etching processes. For example, to form the openings 330, a photoresist layer (not illustrated) may be deposited over the surface passivation layer 130, and photoresist openings may be formed over the locations where the openings 330 in the surface passivation layer 130 are to be formed (including over the source and drain implants 142, 147, FIG. 1). The upper and lower passivation sub-layers 133, 131 may then be etched sequentially through the resist openings.

For example, multiple dry and/or wet etch technique(s) may be used to etch the openings 330 through the upper and lower passivation sub-layers 133, 131. For example, the openings 330 may be formed using reactive ion etching (RIE), inductively coupled plasma (ICP) etching, electron cyclotronic resonance (ECR) etching, thermal or plasma atomic layer etching (ALE), and wet chemical etching, according to various embodiments.

In various embodiments, the etchant used to etch the upper passivation sub-layer 133 (e.g., $Al_2O_3$ or AlN) may selectively etch through the upper passivation sub-layer 133 and then stop on the lower passivation sub-layer 131 (or on the intermediate passivation sub-layer 132, FIG. 3A, if included). In various embodiments, etching the upper passivation sub-layer 133 may include wet and/or dry etch techniques. Suitable wet-etch chemistries for etching through the upper passivation sub-layer 133 may include, for example but not by way of limitation, piranha etch (i.e., a solution of sulfuric acid and hydrogen peroxide), potassium hydroxide (KOH), ammonium hydroxide ($NH_4OH+$), or another suitable wet-etch chemistry. In other embodiment(s), dry etching of the upper passivation sub-layer 133 may include dry etching using suitable techniques (e.g., thermal or plasma ALE, RIE, ICP, or ECR) in conjunction chlorine-based chemistry such as $Cl_2$, tetrachloromethane ($CCl_4$), boron trichloride ($BCl_3$), or other suitable dry-etch chemistries. As specific non-limiting examples, dry etching the upper passivation sub-layer 133 may include dry etching using niobium pentafluoride ($NbF_5$) and carbon tetrachloride ($CCl_4$) or tin acetylacetonate $Sn(acac)_2$ and HF-pyridine.

In embodiments in which an intermediate passivation sub-layer 132 (FIG. 3A) is included between the lower and upper sub-layers 133, 131, the intermediate passivation sub-layer 132 may be etched using an etchant that may selectively etch through the intermediate passivation sub-layer 132, and then stop on the lower passivation sub-layer 131.

The lower passivation sub-layer 131 is etched after the etching process for the upper passivation sub-layer 133 (and the intermediate passivation sub-layer 132, if included) has completed. A different etch process and/or etch chemistry is used to etch the lower passivation sub-layer 131 from the etch process and/or etch chemistry that was used to etch the upper passivation sub-layer 133 (and the intermediate passivation sub-layer 132, if included). In various embodiments, the etchant used to etch the lower passivation sub-layer 131 (e.g., $Si_3N_4$ or other stoichiometries) may selectively etch through the lower passivation sub-layer 131 and then stop on the upper surface 112 of the semiconductor substrate 110. In various embodiments, etching the lower passivation sub-layer 131 may include wet and/or dry etch techniques. Suitable wet-etch chemistries for etching through the lower passivation sub-layer 131 may include, for example but not by way of limitation, hydrofluoric acid (HF), buffered HF, or other suitable wet etchant(s). Suitable dry etching techniques may use, for example but not by way of limitation, one or more of sulphur hexafluoride ($SF_6$), carbon tetrafluoride ($CF_4$), or other suitable chemistries, according to an embodiment.

In some embodiments, such as those described above, the etch of sub-layers 133, 131 may be performed in two or more steps, such as by first etching the upper passivation sub-layer 133 and stopping on the lower passivation sub-layer 131, before switching chemistry to etch the lower passivation sub-layer 131 and stop on the upper surface 112 of the semiconductor substrate 110. In other embodiments, a suitable etch chemistry (e.g., $SF_6$) may etch both upper and lower passivation sub-layers 133, 131, and stop on the surface 112 of the semiconductor substrate 110.

Once formed, the openings 330 in the surface passivation layer 130 may extend across upper surface 112 from the ultimate locations of the later-formed source and drain electrodes 140, 145 (FIG. 1) into the portion 101 of the device 100 where the gate 160 and field plate 190 eventually will be formed. Accordingly, as shown in FIG. 3B, portions 113, 114 of the upper surface 112 of the semiconductor substrate 110 are exposed through the openings 330 on either side of the patterned surface passivation layer 130.

Further, in block 206, a conductive layer 144 is formed on or over the surface passivation layer 130, the portions of the upper surface 112 of the substrate 110 that are exposed over the source and drain implants 142, 147 (FIG. 1), and the additional exposed portions 113, 114 of the upper surface 112 of the substrate 110 that extend between the source and drain implants 142, 147 and the surface passivation layer 130.

According to various embodiments, the conductive layer 144 is formed from one or more etchable metal materials that are suitable for forming an Ohmic contact in conjunction with the source and drain implants 142, 147 (FIG. 1). For example, in some embodiments, the conductive layer 144 may include one or more material layers selected from titanium (Ti), titanium aluminum (TiAl), titanium tungsten (TiW), titanium tungsten nitride (TiWN) or other suitable materials or layer stacks thereof. In some embodiments, if desired for etch selectivity during subsequent steps (e.g., as will be described later in conjunction with blocks 212, 214 and FIGS. 3E, 3F), a thin layer of gold (not illustrated) may be deposited on top of the conductive layer 144 to function as an etch stop. Upon deposition of the conductive layer 144 or at a later time, an annealing process (e.g., rapid thermal annealing) may be used to alloy the Ohmic contact metal of layer 144. When the constituent layer(s) of conductive layer 144 have been deposited and annealed, the conductive layer 144 forms an Ohmic contact with the source and drain regions 142, 147 (FIG. 1).

According to various embodiments, the conductive layer 144 is formed directly on the upper passivation sub-layer 133. In various embodiments, the conductive layer 144 may be deposited by evaporation, sputtering, PVD, or other suitable deposition techniques. For example, the conductive layer 144 may have a thickness in a range of about 10 nanometers (nm) to about 1 micron, although layer 144 may be thinner or thicker, as well.

In block 208 and fabrication stage 303 (FIG. 3C), a selective etch process is used to pattern and etch the conductive layer 144 to form the GFP alignment structures 162, 163 and the SFP alignment structures 192, 193. More specifically, photoresist layer 366 is applied over the conductive layer 144, and a first mask is used to pattern the photoresist layer 366 to expose portions of the conductive layer 144 through openings (not numbered) in the photoresist layer 366. The conductive layer 144 is then etched through the photoresist openings to remove the exposed portions all the way to the upper surface of the surface passivation layer 130 (i.e., the surface of layer 133). For example, in an embodiment, a plasma etch using $Cl_2+CF_4$, $BCl_3+CF_4$, $SF_6+O_2$, or $CF_4+O_2$ plasma may be used to etch the conductive layer 144, while stopping on the surface passivation layer 130. According to an embodiment, the etch selectivity between the conductive layer 144 and the underlying upper passivation sub-layer 133 is >50:2 (e.g., when the conductive layer 144 includes TiW and the upper passivation sub-layer 133 includes $Al_2O_3$).

Figure 3C:
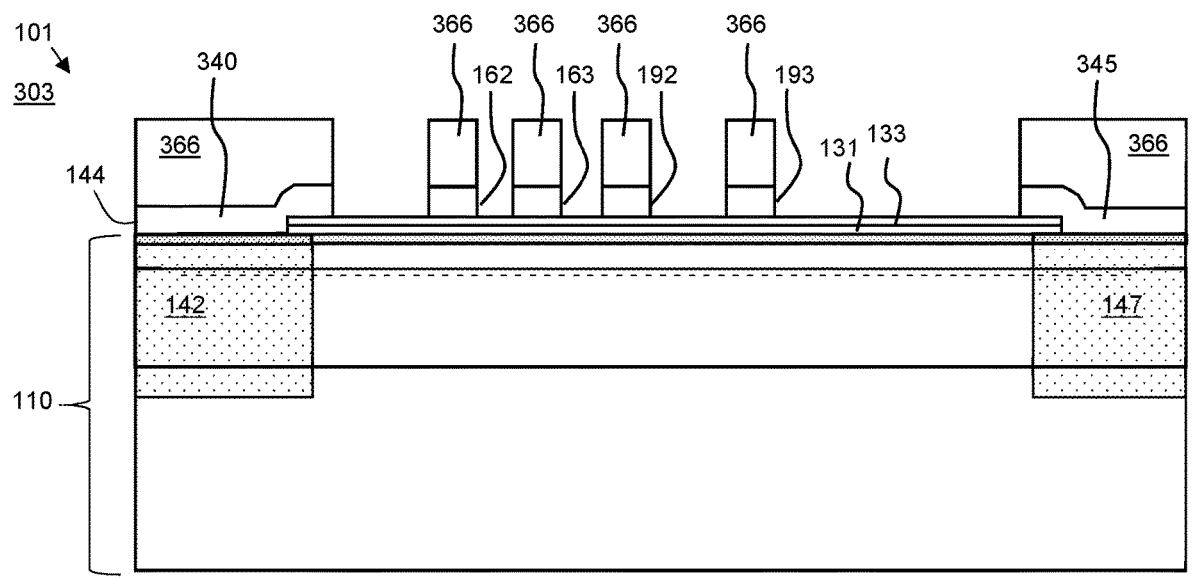
Figure 3D:
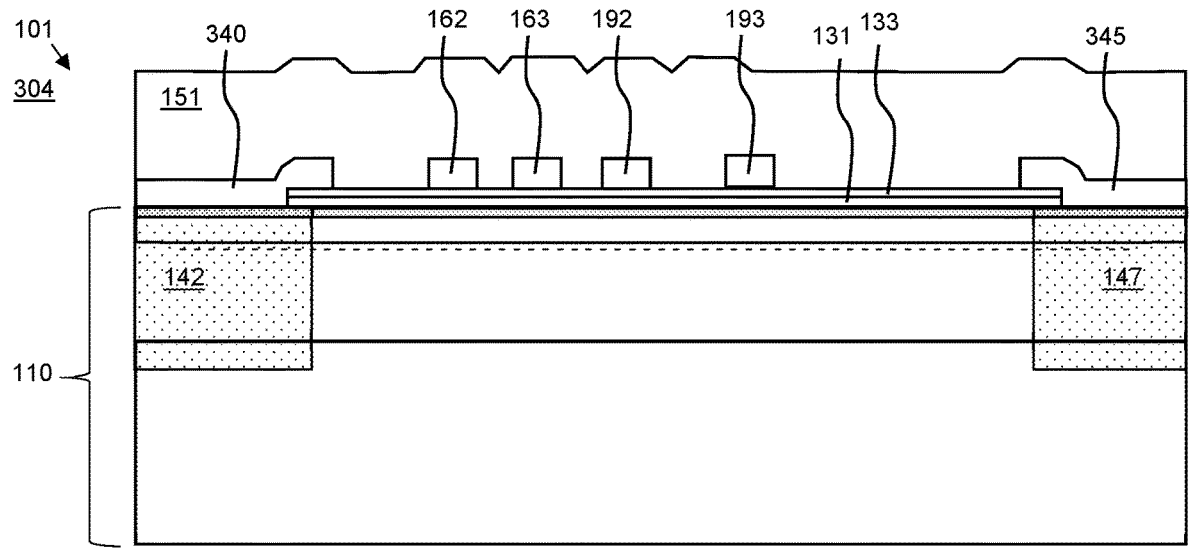
Figure 3E:
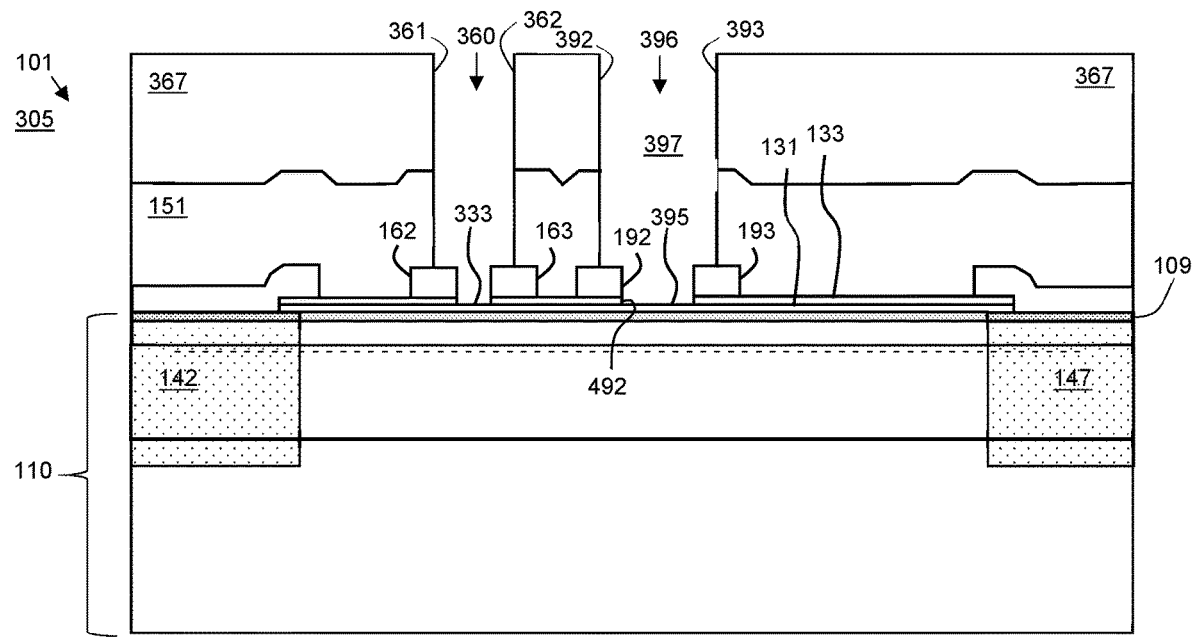
Figure 3F:
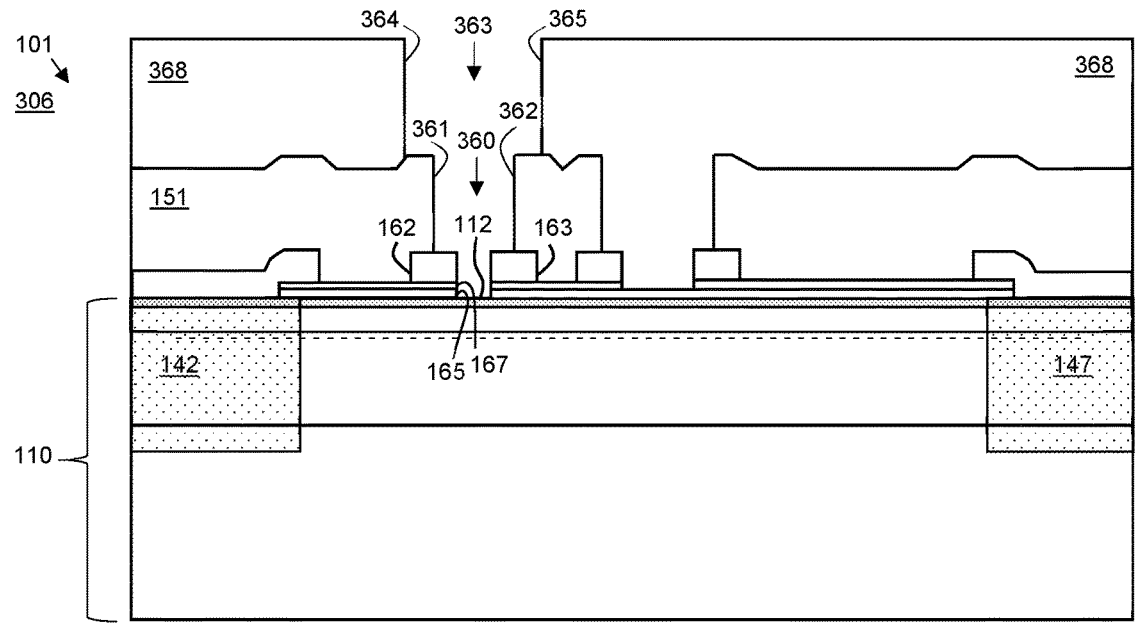
Figure 3G:
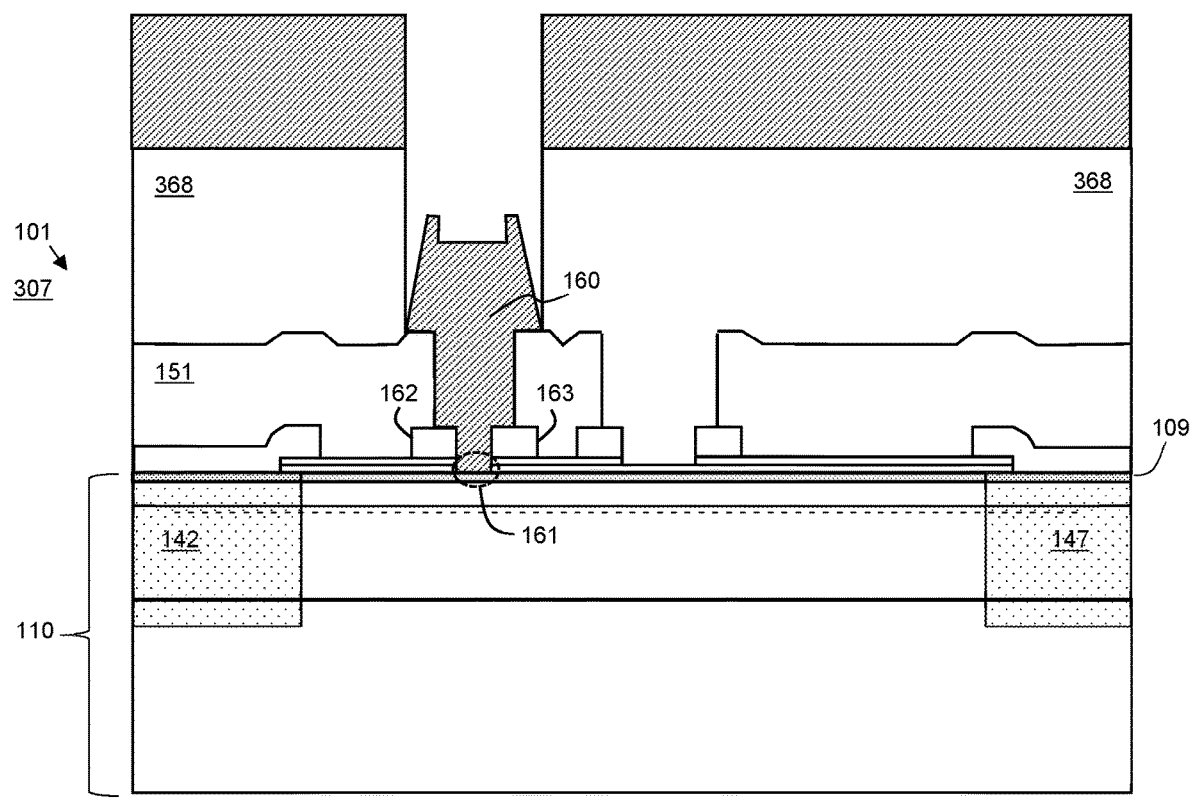
Figure 3H:
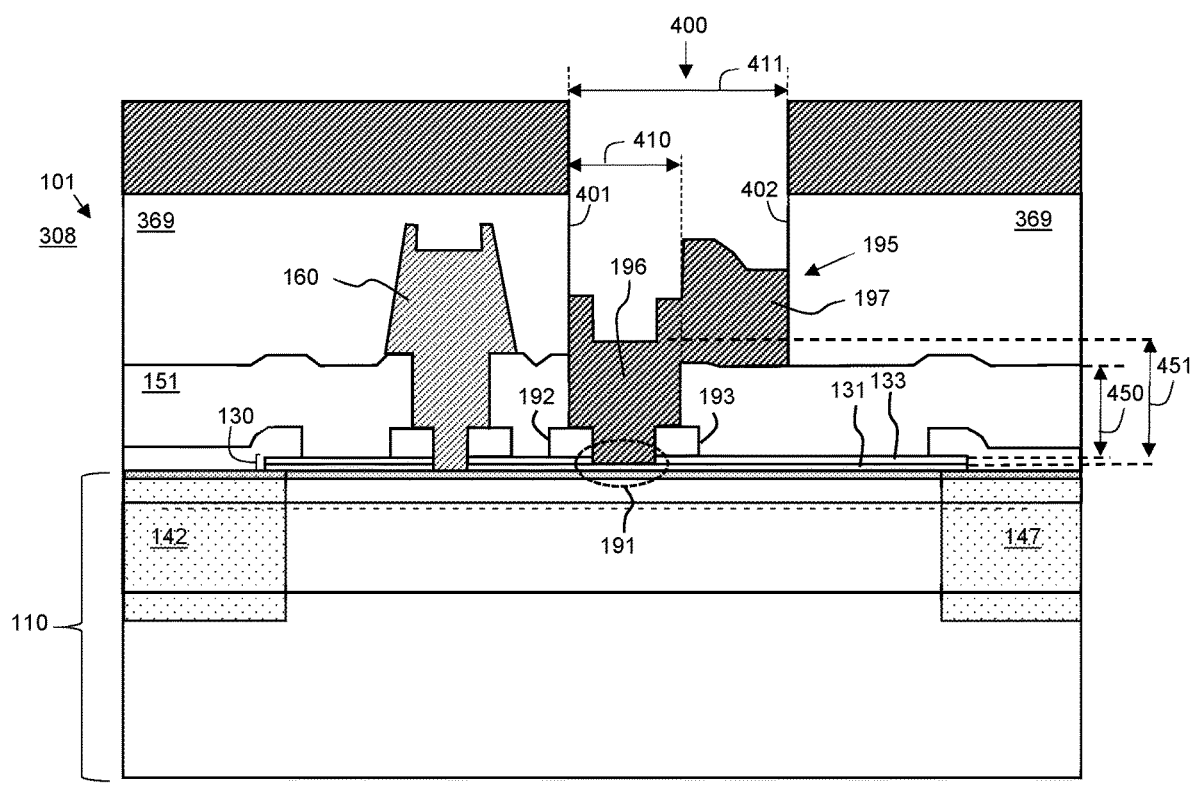
Figure 3I:
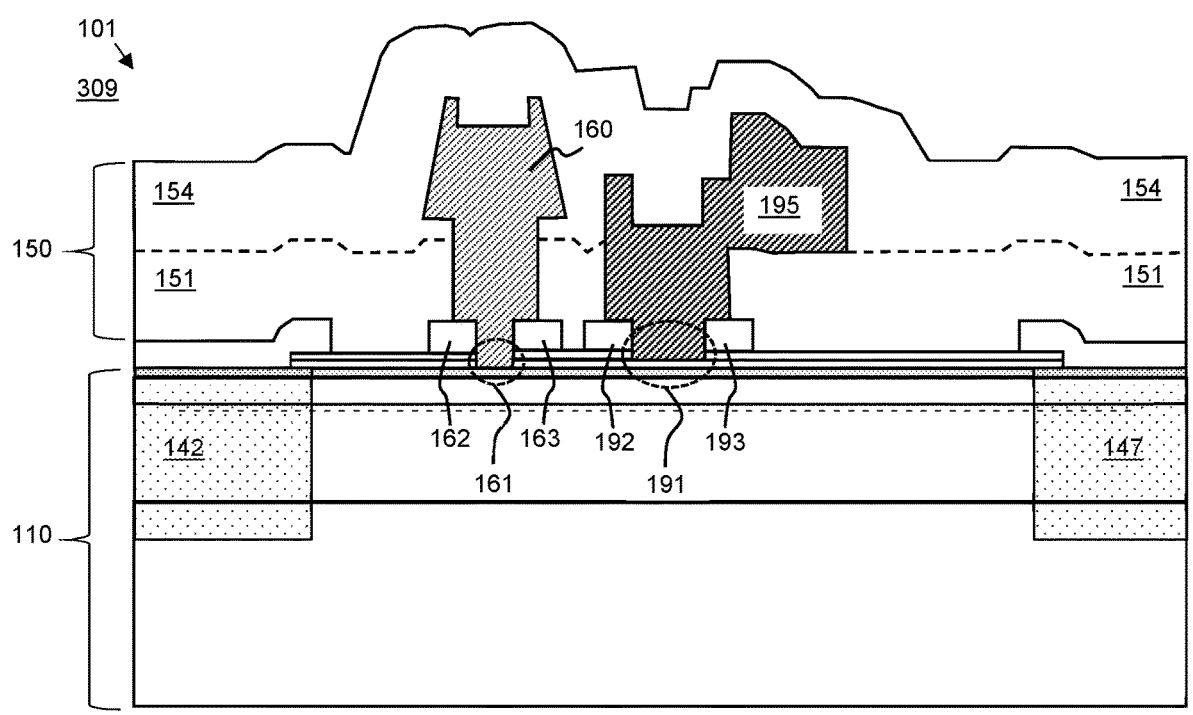

The selective etch process results in the formation of the conductive GFP and SFP alignment structures 162, 163, 192, 193. In addition, the selective etch process also results in the formation of a first conductive extension 340 that extends from a first end of the surface passivation layer 130 to overlie the source implant 142 (FIG. 1), and a second conductive extension 345 that extends from a second end of the surface passivation layer 130 to overlie the drain implant 147 (FIG. 1). The portions of extensions 340 and 345 that overlie the source and drain implants 142, 147 correspond to the source and drain contacts 141, 146 (FIG. 1), respectively. As shown in FIG. 3C, the first and second conductive extensions 340, 345 may be formed to lap up over the source-side and drain-side ends, respectively, of the surface passivation layer 130.

Once the selective etch process has been completed, the photoresist 366 is removed. In an embodiment, the photoresist layer 366 may be configured in a lift-off profile, wherein the openings of the photoresist layer 366 have a retrograde profile, allowing the metal not deposited into resist openings to "lift off" when dissolved in solvents.

As will be discussed in more detail below, because a single mask (i.e., the above-referenced "first mask") was used to define the GFP alignment structures 162, 163 and the SFP alignment structures 192, 193, these structures 162, 163, 192, 193 ensure that the gate channel 161 (FIGS. 1 and 3G) and the later-formed recessed SFP region 191 (FIGS. 1 and 3H) are "self-aligned" with each other despite minor misalignments between the first mask used in this fabrication stage 303 to define the locations of the GFP alignment structures 162, 163 and the SFP alignment structures 192, 193 with subsequently utilized masks used in fabrication stages 305 (FIG. 3E) and 308 (FIG. 3H) to define openings for the gate structure 161 and the source field plate 190, respectively.

In block 210 and fabrication stage 304 (FIG. 3D), a first dielectric layer 151 (e.g., ILD0) is deposited over the source and drain contact extensions 340, 345, the GFP and SFP alignment structures 162, 163, 192, 193, and exposed portions of surface passivation layer 130 (i.e., exposed portions of layer 133). According to an embodiment, the dielectric material used for the first dielectric layer 151 is different from the material used in the upper passivation sub-layer 133. Preferably, the dielectric material used for the first dielectric layer 151 is a low-k dielectric material, which may be selected from tetraethyl orthosilicate (TEOS), $SiO_2$, organo-silicate glass, porous $SiO_2$, SiON, and other suitable materials. In embodiments in which the upper passivation sub-layer 133 is not formed from $Al_2O_3$ or AlN, the first dielectric layer 151 may be formed from $Al_2O_3$ or AlN. The first dielectric layer 151 may be formed using one or more of LPCVD, ALD, sputtering, PVD, PECVD, MOCVD, MBE, ICP deposition, ECR deposition, or other suitable techniques. In various embodiments, the first dielectric layer 151 may have a thickness in a range of about 0.1 microns to about 0.5 microns, although layer 151 may be thinner or thicker, as well.

In block 212 and fabrication stage 305 (FIG. 3E), a selective etch process is used to pattern and etch a partial gate opening and a field plate opening through the first dielectric layer 151 and the upper sub-layer 133 of the surface passivation layer 130, while stopping on the surface of the lower sub-layer 131 (i.e., the lower passivation sub-layer 131 is left essentially intact). More specifically, photoresist layer 367 is applied over the first dielectric layer 151, and the photoresist layer 367 is processed and patterned to form first and second openings 360, 396. The first opening 360 has a first side 361 aligned with GFP alignment structure 162 and a second side 362 aligned with GFP alignment structure 163. The first side 361 has a bottom edge that may terminate anywhere along the top surface of GFP alignment structure 162, and the second side 362 has a bottom edge that may terminate anywhere along the top surface of GFP alignment structure 163. Similarly, the second opening 396 has a first side 392 aligned with SFP alignment structure 192 and a second side 393 aligned with SFP alignment structure 193. The first side 392 has a bottom edge that may terminate anywhere along the top surface of SFP alignment structure 192, and the second side 393 has a bottom edge that may terminate anywhere along the top surface of SFP alignment structure 193.

Accordingly, the mask used to pattern photoresist layer 367 may be slightly mis-aligned with the mask that was used in fabrication stage 303 (FIG. 3C) to pattern photoresist layer 366, without affecting the ultimate relative positioning of the later-formed gate channel 161 and recessed SFP region 191. In other words, the edges 361, 362, 392, 393 of the openings 360, 396 may shift left or right, in the perspective of FIG. 3E, across the top surfaces of GFP and SFP alignment structures 162, 163, 192, 193 without affecting the location of the later-formed gate channel 161 and recessed SFP region 191. As long at the edges 361, 362, 392, 393 land on the top surfaces of the FP and SFP alignment structures 162, 163, 192, 193, the recessed gate channel 161 and SFP region 191 will be properly aligned.

The portions of the first dielectric layer 151 and the upper passivation sub-layer 133 that are sequentially exposed through openings 360, 396 are sequentially etched through openings 360, 396 to remove the exposed portions of the layers 151, 133. The etching process continues until the portions of the upper passivation sub-layer 133 that are exposed between GFP and SFP alignment structures 162, 163, 192, and 193 are removed. According to an embodiment, the etching process continues until a portion 333 of the upper surface of the lower passivation sub-layer 131 between the GFP alignment structures 162, 163 is reached, and a portion 395 of the upper surface of the lower passivation sub-layer 131 between the SFP alignment structures 192, 193 is reached (i.e., the etching process stops on lower passivation sub-layer 131).

Multiple dry and/or wet etch technique(s) may be used sequentially to etch openings through the first dielectric layer 151 and through the upper passivation sub-layer 133. In some embodiments, and particularly for thicker layers such as layers 151 and 154, a dry etch may be preferable over a wet etch because the dry etch enables anisotropic etching. For example, the first dielectric layer 151 may be etched using reactive ion etching (RIE), inductively coupled plasma (ICP) etching, electron cyclotronic resonance (ECR) etching, and wet chemical etching, according to various embodiments. Suitable dry etching techniques for etching layer 151 may use, for example but not by way of limitation, one or more of sulphur hexafluoride ($SF_6$), carbon tetrafluoride ($CF_4$), a combination of $SF_6$ and $C_4F_8$, di-carbon hexafluoride ($C_2F_6$) and $H_2$, combinations thereof, or other suitable chemistries, according to an embodiment.

In various embodiments, the etchant used to etch the upper passivation sub-layer 133 (e.g., $Al_2O_3$ or AlN) may selectively etch through the upper passivation sub-layer 133 and then stop on the lower passivation sub-layer 131. Suitable wet-etch chemistries and dry etching techniques for etching through the upper passivation sub-layer 133 were described above in conjunction with fabrication stage 302 (FIG. 3B), and those chemistries and techniques apply to this etching process as well.

In some embodiments, such as those described above, the etch of layers 151, 133 may be performed in multiple steps, such as by first etching the first dielectric layer 151 and stopping on the upper passivation sub-layer 133, before switching chemistry to etch the upper passivation sub-layer 133 and stop on the lower passivation sub-layer 131. In some embodiments, use of an intermediate surface passivation sub-layer 132 may provide an etch stop for the chemistry used to etch the upper passivation sub-layer 133 (e.g., $BCl_3$ or $C_4F_8$ plasma). In other embodiments, a suitable etch chemistry may etch both of layers 151, 133 and stop on the lower passivation sub-layer 131. In some embodiments, etching of the upper passivation sub-layer 133 may be postponed to a later stage (not shown).

Along with creating an partial gate opening, this process results in an unfilled field plate via 397 formed through the first dielectric layer 151 over and between the SFP alignment structures 192, 193, with the portion 395 of the lower passivation sub-layer 131 defining the bottom extent of the via 397. Starting at the bottom of the unfilled field plate via 397, the via sidewalls include exposed sidewalls 492 of the etched-through upper passivation sub-layer 133, exposed sidewalls of the SFP alignment structures 192, 193, exposed portions of the upper surfaces of the SFP alignment structures 192, 193, and exposed sidewalls of the first dielectric layer 151. It may be noted at this point that the portion 395 of the exposed surface of the lower passivation sub-layer 131 defines a "recessed" portion of the unfilled field plate via 397 (i.e., surface 395 is recessed with respect to the upper surface of surface passivation layer 130, or the upper surface of upper passivation sub-layer 133). After forming the partial gate opening and the unfilled field plate via 397, photoresist layer 367 is removed.

In block 214 and fabrication stage 306 (FIG. 3F), formation of the gate opening is completed. To complete formation of the gate opening, another photoresist layer 368 is applied over the first dielectric layer 151, and the photoresist layer 368 is processed and patterned to form opening 363. Opening 363 may be wider than the opening 360 used to form the partial gate opening. Specifically, opening 363 has a first side 364 that may terminate along a portion of the top surface of the first dielectric layer 151 to the left of GFP alignment structure 162, and a second side 365 that may terminate along a portion of the top surface of the first dielectric layer 151 to the right of GFP alignment structure 163.

The portion of the lower passivation sub-layer 131 that is exposed through opening 363 is then etched through opening 363 to remove the exposed portion of layer 131. The etching process continues until the portion of the passivation sub-layer 131 that is exposed between GFP alignment structures 162 and 163 is removed. According to an embodiment, the etching process continues until a portion upper surface 112 of the substrate 110 between the GFP alignment structures 162, 163 is reached (e.g., the surface of cap layer 109). At this point, the upper surface 112 of the semiconductor substrate 110, sidewalls of the GFP alignment structures 162, 163, and sidewalls 165, 167 of the etched-through lower and upper passivation sub-layers 131, 133 are exposed in the opening 360. In embodiments that postponed etching of the upper passivation sub-layer 133 (in block 212 and fabrication stage 305), the upper passivation sub-layer 133 would be etched prior to etching the lower passivation sub-layer 131, and the intermediate passivation sub-layer 132, if present. In some of these embodiments, suitable chemistry for etching through the entire surface passivation layer 130 and stopping on the upper surface 112 of substrate 110 may be employed.

A different etch process and/or etch chemistry may be used to etch the lower passivation sub-layer 131 from the etch process and/or etch chemistry that was used to etch the upper passivation sub-layer 133. Suitable wet-etch chemistries and dry etching techniques for etching through the lower passivation sub-layer 131 were described above in conjunction with fabrication stage 302 (FIG. 3B), and those chemistries and techniques apply to this etching process as well.

In block 216 and fabrication stage 307 (FIG. 3G), the gate electrode 160 (or gate metal stack) is formed by depositing one or more layers of gate metal into opening 360 using, for example, metal evaporation processes. During the deposition process, the patterned photoresist layer 368 (FIG. 3F) may be used as a mask to prevent the gate metal from depositing in other regions in a lift-off process.

For example, depositing gate metal to form the gate electrode 160 may include depositing a multi-layer stack that includes one or more metal layers and/or other suitable materials, according to various embodiments. In some embodiments, a first layer within a multi-layer stack used to form the gate electrode 160 may include a metal that provides a good Schottky barrier (e.g., nickel (Ni) or another suitable metal), followed by a diffusion barrier layer (e.g., platinum (Pt) or another suitable metal). The remainder of the gate electrode 160 may be formed from gold (Au), copper (Cu), or other suitable metals. The first layer of gate metal may contact the portion of the top surface 112 of the semiconductor substrate 110 located between the GFP alignment structures 162, 163. In addition, the gate metal layers may contact exposed sidewalls 165, 167 (FIG. 3F) of the lower and upper passivation sub-layers 131, 133, exposed sidewalls and top surfaces of the GFP alignment structures 162, 163, and sidewalls of the opening in the first dielectric layer 151. It may be noted at this point that the upper and lower passivation sub-layers 131, 133 are present on both the source-side and the drain-side of the gate electrode 160. The first gate metal layer defines the gate channel 161 (i.e., the intersection between the gate electrode 160 and the substrate 110). After forming the gate electrode 160, photoresist layer 368 is removed.

In block 218 and fabrication stage 308 (FIG. 3H), a third SFP element 195 is formed between the first and second SFP alignment structures 192, 193. To form the third SFP element 195, another photoresist layer 369 is applied over the first dielectric layer 151 and the gate electrode 160, and the photoresist layer 369 is processed and patterned to form opening 400. Opening 400 may be wider than the previously formed opening 396 in photoresist 367 (FIG. 3E). Specifically, opening 400 has a first side 401 that may align with the gate-side sidewall of the unfilled field plate via 397 (FIG. 3E) formed through the first dielectric layer 151, and a second side 402 that may terminate along a portion of the top surface of the first dielectric layer 151 to the right of the drain-side sidewall of the unfilled field plate via 397. For example, a width 411 of the opening 400 may be from 110 percent to 400 percent of the width 410 of the previously-formed, unfilled field plate via 397 (FIG. 3E). In embodiments that postponed etching of the upper passivation sub-layer 133 (in block 212 and fabrication stage 305), the upper passivation sub-layer 133, the intermediate passivation sub-layer 132, if present, and the lower passivation sub-layer 131 would be etched at this stage of the process using suitable wet/dry etch chemistry. Some consumption of the first dielectric layer 151 due to limited selectivity of the etchant may be tolerated.

To form the third SFP element 195, conductive material is deposited into the opening 400 through photoresist 369. According to various embodiments, the third SFP element 195 is formed from one or more electrically conductive materials. For example, in some embodiments, the conductive materials may include one or more lower material layers selected from Ti, TiW, TiWN, TiAl, or other suitable materials or layer stacks thereof, which are deposited into the opening 400 to contact the recessed portion 395 (FIG. 3E) of the previously-exposed surface of the lower passivation sub-layer 131 395 between the SFP alignment structures 192, 193. In addition, in some embodiments, a barrier layer (e.g., Ni) may be deposited over the lower material layer(s), and gold may be deposited over the barrier layer.

According to various embodiments, the layers of the third SFP element 195 may be deposited by evaporation, sputtering, PVD, or other suitable deposition techniques. The constituent layers of the third SFP element 195 have a thickness 451 that exceeds (e.g., by at least 10 percent) the height 450 of the first dielectric layer 151. For example, the third SFP element 195 may have a thickness 451 in a range of about 0.1 microns to about 1.0 microns, although the third SFP element 195 may be thinner or thicker, as well. This results in a third SFP element 195 with at least two integrally-formed and connected portions: a first portion 196 disposed within the previously-formed field plate via 397 (FIG. 3E); and a second portion 197 disposed over the surface of the first dielectric layer 151. Because the second portion 197 of the third SFP element 195 extends over the first dielectric layer 151, the second portion 197 also may be referred to herein as an "overhanging" portion 197 of the third SFP element 195. As can be seen in FIG. 3H, the overhanging portion 197 is separated, in the vertical direction, from the surface 112 of the substrate 110 by the full height 450 of the first dielectric layer 151 plus the full thickness of the surface passivation layer 130. The overhanging portion 197 may function to reduce the electric field around the first and second SFP alignment structures 192, 193, while increasing the dielectric voltage withstand capability of the device 100, as mentioned above. After forming the third SFP element 195, photoresist 369 is removed.

In block 220 and fabrication stage 309 (FIG. 3I), a second dielectric layer 154 (e.g., ILD1) is deposited over the first dielectric layer 151, the gate electrode 160, and the third SFP element 195. The first and second dielectric layers 151, 154 together comprise the "additional" dielectric layers 150 of FIG. 1. In various embodiments, the dielectric material used for the second dielectric layer 154 may be the same or different from the dielectric material used for the first dielectric layer 151. Preferably, the dielectric material used for the second dielectric layer 154 is a low-k dielectric material, which may be selected from TEOS, $SiO_2$, organosilicate glass, porous $SiO_2$, SiON, $HfO_2$, $Al_2O_3$ or AlN, and other suitable materials. The second dielectric layer 154 may be formed using one or more of LPCVD, ALD, sputtering, PVD, PECVD, MOCVD, MBE, ICP deposition, ECR deposition, or other suitable techniques. In various embodiments, the second dielectric layer 154 may have a thickness in a range of about 0.2 microns to about 2.0 microns, although layer 154 may be thinner or thicker, as well.

In block 222 and fabrication stage 310 (FIG. 3J), yet another photoresist layer 370 is applied over the additional dielectric layers 150, and the photoresist layer 370 is processed and patterned to form an opening 420 over the third SFP element 195. This opening 420 exposes an upper surface of dielectric layer 150. The portion of the dielectric layer 150 (and more specifically the second dielectric layer 154) that is exposed through opening 420 is then etched through opening 420 to remove the exposed portion of layer 150. The etching process continues until the third SFP element 195 is reached. The dielectric layer 150 may be etched using techniques and etch chemistries described in detail in conjunction with FIG. 3E. In addition to forming opening 420, additional openings (not shown in FIG. 3J) are formed in photoresist layer 370 at the ultimate locations of the to-be-formed source and drain electrodes 140, 147 (FIG. 1), in order to provide conductive vias through which those electrodes 140, 145 will be formed in a following fabrication stage (e.g., stage 311, FIG. 3K, corresponding to block 224).

After revealing the third SFP element 195 and forming the source and drain electrode vias, the etching process stops, and photoresist 370 is removed.

Figure 3J:
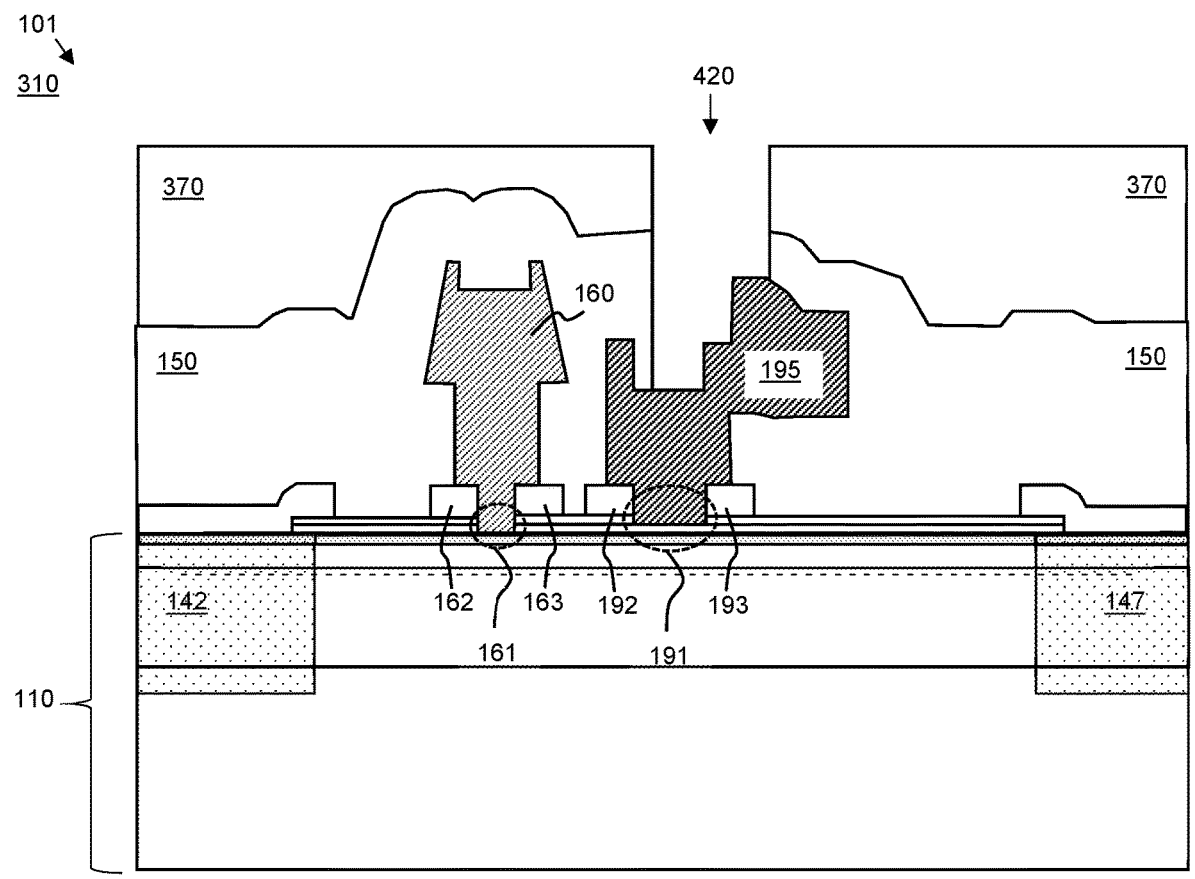
Figure 3K:
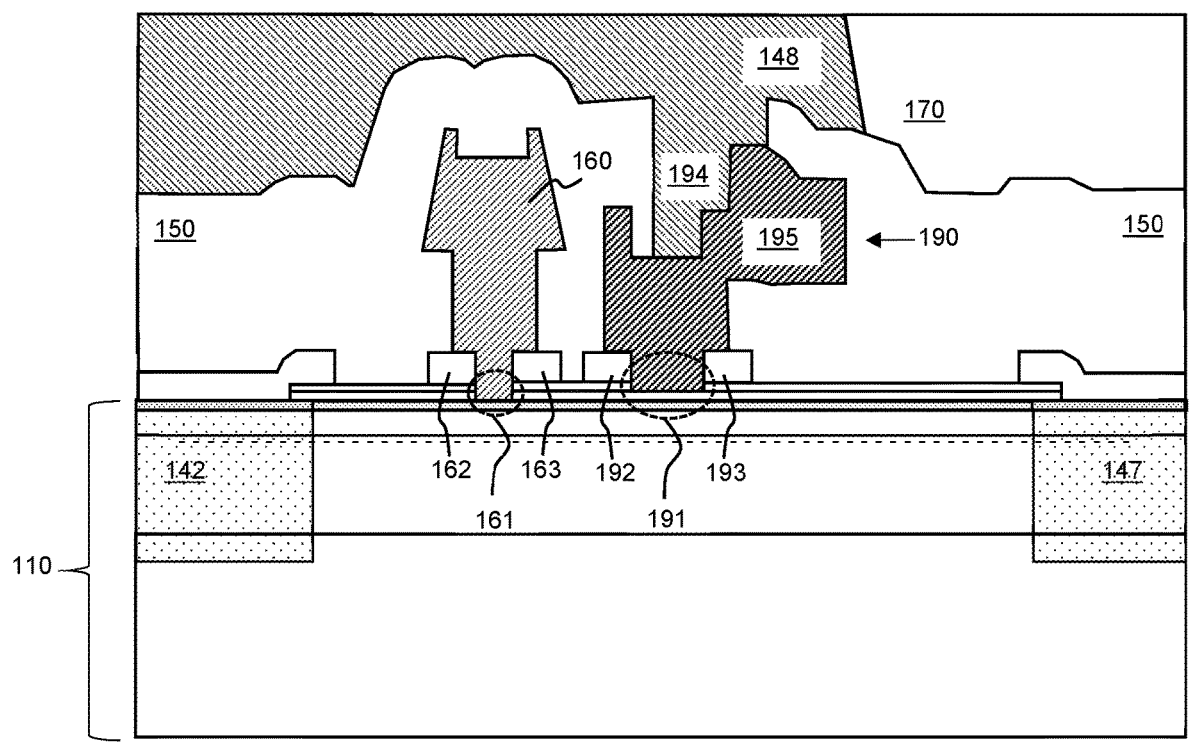

In block 224 and fabrication stage 311 (FIG. 3K), source and drain metallization 148, 149 are deposited. According to an embodiment, the source metallization 148 is deposited so that it contacts the upper surface of the third SFP element 195 and fills the opening in the dielectric layer 150 that was formed in fabrication stage 310 (FIG. 3J). This completes the formation of the conductive field plate via 194. Further, the source metallization 148 is deposited so that it extends from the conductive field plate via 194 over the dielectric layer 150 to the source contact 141. Once completed, the source-connected field plate 190 includes the recessed SFP region 191, the first and second SFP alignment structures 192, 193, the third SFP element 195, and the field plate via 194.

Depositing the source and drain metallization 148, 149 may include depositing a multi-layer stack that includes one or more metal layers and/or other suitable materials, according to various embodiments. In some embodiments, a first layer within a multi-layer stack used to form the source and drain metallization 148, 149 (and thus the field plate via 194) may include an adhesion layer (e.g., TiW or another suitable material), and additional layers may include gold (Au) and other suitable metals.

In an embodiment, the photoresist layer(s) (not illustrated) used to deposit the source and drain metallization 148, 149 may be configured in a lift-off profile, wherein the openings of the photoresist layer(s) have a retrograde profile, allowing the metal not deposited into resist openings to "lift off" when dissolved in solvents.

At this point, in block 226, the device 100 may be completed by depositing the final passivation layers 170 and 180 (FIG. 1). For example, passivation layer 170 may be formed from $Si_3N_4$ or another suitable material, and passivation layer 180 may be formed from polybenzoxazoles (PBO) or another suitable material. Passivation layers 170, 180 may be deposited, for example, using one or more of LPCVD, ALD, sputtering, PVD, PECVD, MOCVD, MBE, ICP deposition, ECR deposition, or other suitable techniques.

Figure 4:
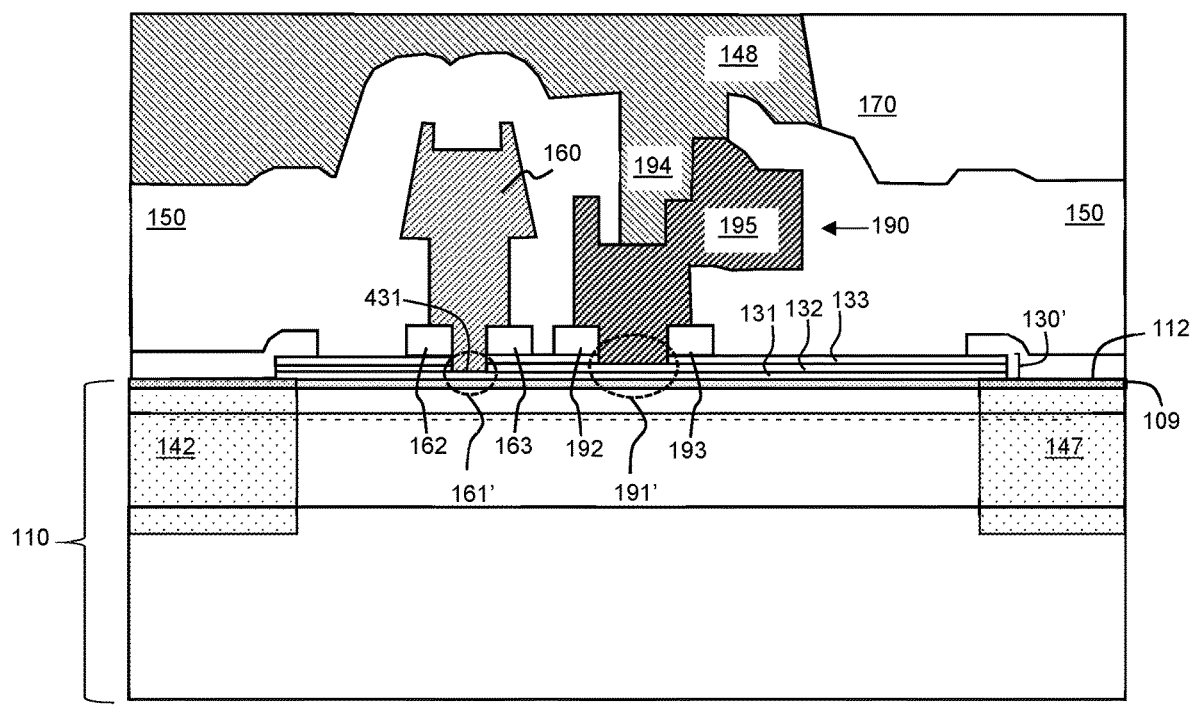
FIG. 4 is a cross-sectional, side view of an exemplary metal insulator semiconductor field effect transistor (MISFET), in accordance with an embodiment.

As mentioned previously, in some embodiments, a gate insulator may be formed between the gate electrode 160 and the semiconductor substrate 110 to form a metal-insulator semiconductor field effect transistor (MISFET) device. FIG. 4 is a cross-sectional, side view of a portion 101' of an exemplary metal insulator semiconductor field effect transistor (MISFET), in accordance with an embodiment. It should be noted here that FIG. 4 only depicts a portion 101' of a MISFET device in which the gate and field plate are formed so that the important and enlarged details of the device can be easily seen. It should be noted that portion 101' in FIG. 4 corresponds to portion 101 of FIG. 1. According to an embodiment, portion 101' in FIG. 4 may replace portion 101 of FIG. 1 to provide a MISFET.

The primary difference between the HFET 100 of FIGS. 1 and 3 and the MISFET of FIG. 4 is that the MISFET of FIG. 4 includes a surface passivation layer 130' with at least three sub-layers (e.g., as shown in callout 101' of FIG. 3A), rather than a two-layer surface passivation layer 130. Accordingly, in FIG. 4, the surface passivation layer 130' includes lower, intermediate, and upper passivation sub-layers 131, 132, 133. In some embodiments, such as that shown in FIG. 3A, surface passivation layer 130 includes only two passivation sub-layers 131, 133. The lower passivation sub-layer 131 is disposed on or over the upper surface 112 of the semiconductor substrate 110, the intermediate passivation sub-layer 132 is disposed on or over the lower passivation sub-layer 131, and the upper passivation sub-layer 133 is disposed on or over the intermediate passivation sub-layer 132.

In various embodiments, the lower and upper passivation sub-layers 131, 133 may be formed using methods and materials described in conjunction with FIG. 3, and the details regarding the lower and upper passivation sub-layers 131, 133 are incorporated herein.

The intermediate passivation sub-layer 132 may be formed from a different dielectric material from the lower and upper passivation sub-layers 131, 133. For example, in some embodiments, the intermediate passivation sub-layer 132 may include a thin $SiO_2$ layer sandwiched in-between the lower and upper passivation sub-layers 131, 133. The intermediate passivation sub-layer 132 may have a thickness in a range of 10 to 200 angstroms, in some embodiments, although layer 132 may be thinner or thicker, as well.

An additional difference between the MISFET of FIG. 4 and the HFET of FIG. 3 is that, in the portion 101' of the MISFET illustrated in FIG. 4, the gate opening is etched (e.g., in block 214 and step 306, FIG. 3F) through both the upper and intermediate passivation sub-layers 133, 132 of the surface passivation layer 130', while stopping on the lower passivation sub-layer 131. During this process, a gate insulator 431 is formed from a portion of the lower passivation sub-layer 131, and the gate insulator 431 remains when the process of etching the gate opening has completed, resulting in a modified gate channel 161'.

Yet another difference between the MISFET of FIG. 4 and the HFET of FIG. 3 is that, to form the opening for the third SFP element 195 shown in portion 101' of the MISFET illustrated in FIG. 4, the upper passivation sub-layer 133 is etched (e.g., in block 212 and step 305, FIG. 3E), and a portion of the exposed surface of the intermediate passivation sub-layer 132 defines the recessed portion of the unfilled field plate via 396. Once the third SFP element 195 is formed, the portion of the exposed surface of the intermediate passivation sub-layer 132 defines the bottom extent of a modified, recessed SFP region 191'. Accordingly, as with the previously-described embodiments in FIG. 3, in the MISFET of FIG. 4, the gate electrode 160 extends deeper into the passivation layer 130' than the third SFP element 195 of the conductive field plate 190 does (i.e., the gate electrode 160 is recessed with respect to the conductive field plate 190). In other MISFET embodiments, gate insulator 431 and the dielectric material between the recessed SFP region 191' and the upper surface 112 of the substrate 110 both may be formed by the lower surface passivation sub-layer 131, resulting in a cascode MISFET structure.

An embodiment of a semiconductor device includes a semiconductor substrate with an upper surface and a channel, source and drain electrodes over the upper surface of the semiconductor substrate, a passivation layer between the source and drain electrodes, a first dielectric layer over the passivation layer, a gate electrode between the source and drain electrodes, and a conductive field plate adjacent to the gate electrode. The passivation layer includes a lower passivation sub-layer and an upper passivation sub-layer over the lower passivation sub-layer. The gate electrode includes a lower portion that extends through the passivation layer. The conductive field plate includes a first portion with a recessed region that extends through the upper passivation sub-layer but does not extend through the lower passivation sub-layer, and an overhanging portion that extends over an upper surface of the first dielectric layer.

Another embodiment of a semiconductor device includes a semiconductor substrate with an upper surface and a channel, source and drain electrodes over the upper surface of the semiconductor substrate, a passivation layer over the upper surface of the semiconductor substrate and between the source and drain electrodes, a first dielectric layer over the passivation layer, a gate electrode over the upper surface of the semiconductor substrate between the source and drain electrodes, and a conductive field plate adjacent to the gate electrode. The source and drain electrodes are electrically coupled to the channel, and the channel extends between the source and drain electrodes. The passivation layer includes a lower passivation sub-layer over the upper surface of the semiconductor substrate, an intermediate passivation sub-layer over the lower passivation sub-layer, and an upper passivation sub-layer over the intermediate passivation sub-layer. The gate electrode includes a lower portion that extends through the upper passivation sub-layer and through the intermediate passivation sub-layer. The conductive field plate includes a first portion with a recessed region that extends through the upper passivation sub-layer but does not extend through the lower passivation sub-layer, and an overhanging portion that extends over an upper surface of the first dielectric layer. The conductive field plate and the upper surface of the semiconductor substrate are separated by a portion of the lower passivation sub-layer, and the lower portion of the gate electrode extends deeper into the passivation layer than the conductive field plate.

A method of forming a semiconductor device includes forming source and drain electrodes over an upper surface of a semiconductor substrate that includes a channel, where the source and drain electrodes are electrically coupled to the channel, and the channel extends between the source and drain electrodes. The method further includes depositing a passivation layer over the upper surface of the semiconductor substrate by depositing a lower passivation sub-layer on the upper surface of the semiconductor substrate, and depositing an upper passivation sub-layer over the lower passivation sub-layer. The lower passivation sub-layer is formed from a first dielectric material, and the upper passivation sub-layer is formed from a second dielectric material that is different from the first dielectric material. The method further includes forming a first dielectric layer over the passivation layer, forming a first opening at least partially through the first dielectric layer and through the passivation layer between the source and drain electrodes, and depositing a gate electrode over the semiconductor substrate between the source and drain electrodes. The gate electrode includes a lower portion that extends into the first opening in the passivation layer to contact the semiconductor substrate. The method further includes forming a second opening through the upper passivation sub-layer adjacent to the gate electrode, where the second opening does not extend through the lower passivation sub-layer, and the second opening is shallower than the first opening. The method further includes forming a conductive field plate over the semiconductor substrate and adjacent to the gate electrode. The conductive field plate includes a first portion with a recessed region that extends through the upper passivation sub-layer but does not extend through the lower passivation sub-layer, and an overhanging portion that extends over an upper surface of the first dielectric layer.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
   a semiconductor substrate with an upper surface and a channel;
   source and drain electrodes over the upper surface of the semiconductor substrate, wherein the source and drain electrodes are electrically coupled to the channel, and the channel extends between the source and drain electrodes;
   a passivation layer over the upper surface of the semiconductor substrate and between the source and drain electrodes, wherein the passivation layer includes a lower passivation sub-layer over the upper surface of the semiconductor substrate, and an upper passivation sub-layer over the lower passivation sub-layer;
   a first dielectric layer over the passivation layer;
   a gate electrode over the upper surface of the semiconductor substrate between the source and drain electrodes, wherein the gate electrode includes a lower portion that extends through the first dielectric layer and the passivation layer; and
   a conductive field plate adjacent to the gate electrode, wherein the conductive field plate includes a first portion with a recessed region that extends through the upper passivation sub-layer but does not extend through the lower passivation sub-layer, and an overhanging portion that extends over an upper surface of the first dielectric layer.

2. The semiconductor device of claim 1, wherein the first portion and the overhanging portion of the conductive field plate are integrally-formed and connected portions of the conductive field plate.

3. The semiconductor device of claim 1, wherein the conductive field plate is formed from one or more materials selected from titanium (Ti), titanium tungsten (TiW), titanium tungsten nitride (TiWN), and titanium aluminum (TiAl).

4. The semiconductor device of claim 1, wherein the recessed region and the upper surface of the semiconductor substrate are separated by the lower passivation sub-layer.

5. The semiconductor device of claim 1, wherein the overhanging portion and the upper surface of the semiconductor substrate are separated by the first dielectric layer and the passivation layer.

6. The semiconductor device of claim 1, wherein the overhanging portion of the conductive field plate is configured to increase a dielectric voltage withstand capability of the semiconductor device.

7. The semiconductor device of claim 1, wherein:
the upper passivation sub-layer is formed from a first dielectric material that is etchable using a first etch chemistry that has a high etch selectivity to the first dielectric material; and
the lower passivation sub-layer is formed from a second dielectric material that is different from the first dielectric material, and that functions as an etch stop for the first etch chemistry.

8. The semiconductor device of claim 7, wherein:
the first dielectric material of the upper passivation sub-layer is a material selected from aluminum oxide, aluminum nitride, and silicon dioxide; and
the second dielectric material of the lower passivation sub-layer is silicon nitride.

9. The semiconductor device of claim 7, wherein the passivation layer further comprises an intermediate passivation sub-layer that is formed from a third dielectric material that is different from the first dielectric material, and that functions as an etch stop for the first etch chemistry.

10. The semiconductor device of claim 9, wherein:
the first dielectric material of the upper passivation sub-layer is a material selected from aluminum oxide and aluminum nitride;
the second dielectric material of the lower passivation sub-layer is silicon nitride; and
the third dielectric material of the intermediate passivation sub-layer is silicon dioxide.

11. The semiconductor device of claim 1, further comprising:
a patterned conductive layer with first, second, third, and fourth portions positioned on the passivation layer, wherein
the first and second portions form first and second gate alignment structures positioned at first and second sides of the gate electrode, respectively, and
the third and fourth portions form first and second field plate alignment structures positioned at first and second sides of the conductive field plate.

12. The semiconductor device of claim 11, wherein the patterned conductive layer is formed from a material selected from titanium (Ti), titanium tungsten (TiW), titanium tungsten nitride (TiWN), and titanium aluminum (TiAl).

13. The semiconductor device of claim 11, wherein the overhanging portion of the conductive field plate is configured to reduce an electric field around the first and second field plate alignment structures during operation of the semiconductor device.

14. The semiconductor device of claim 1, wherein the gate electrode contacts the upper surface of the semiconductor substrate.

15. The semiconductor device of claim 1, wherein the gate electrode contacts sidewalls of an opening through the upper passivation sub-layer, and contacts sidewalls of an opening through the lower passivation sub-layer.

16. The semiconductor device of claim 1, wherein the conductive field plate contacts sidewalls of the upper passivation sub-layer.

17. The semiconductor device of claim 1, wherein the upper and lower passivation sub-layers are present on a source-side and a drain-side of the gate electrode.

18. A semiconductor device comprising:
a semiconductor substrate with an upper surface and a channel;
source and drain electrodes over the upper surface of the semiconductor substrate, wherein the source and drain electrodes are electrically coupled to the channel, and the channel extends between the source and drain electrodes;
a passivation layer over the upper surface of the semiconductor substrate and between the source and drain electrodes, wherein the passivation layer includes a lower passivation sub-layer over the upper surface of the semiconductor substrate, an intermediate passivation sub-layer over the lower passivation sub-layer, and an upper passivation sub-layer over the intermediate passivation sub-layer;
a first dielectric layer over the passivation layer;
a gate electrode over the upper surface of the semiconductor substrate between the source and drain electrodes, wherein the gate electrode includes a lower portion that extends through the upper passivation sub-layer and through the intermediate passivation sub-layer; and
a conductive field plate adjacent to the gate electrode, wherein the conductive field plate includes a first portion with a recessed region that extends through the upper passivation sub-layer but does not extend through the lower passivation sub-layer, and an overhanging portion that extends over an upper surface of the first dielectric layer, wherein the conductive field plate and the upper surface of the semiconductor substrate are separated by a portion of the lower passivation sub-layer, and wherein the lower portion of the gate electrode extends deeper into the passivation layer than the conductive field plate.

19. The semiconductor device of claim 18, wherein:
a first dielectric material of the upper passivation sub-layer is a material selected from aluminum oxide and aluminum nitride;
a second dielectric material of the intermediate passivation sub-layer is silicon dioxide; and
a third dielectric material of the lower passivation sub-layer is silicon nitride.

20. The semiconductor device of claim 18, wherein:
the lower portion of the gate electrode also extends through the lower passivation sub-layer to contact the upper surface of the semiconductor substrate.

21. The semiconductor device of claim 20, wherein:
the recessed region of the conductive field plate extends through the upper passivation sub-layer and through the intermediate passivation sub-layer.

22. The semiconductor device of claim 18, wherein:
the lower portion of the gate electrode does not extend through the lower passivation sub-layer, and a portion of the lower passivation layer forms a gate insulator between the gate electrode and the upper surface of the semiconductor substrate.

23. The semiconductor device of claim 22, wherein:
the recessed region of the conductive field plate extends through the upper passivation sub-layer but does not extend through the intermediate passivation sub-layer.

24. The semiconductor device of claim 18, wherein the gate electrode contacts sidewalls of an opening through the upper passivation sub-layer, and contacts sidewalls of an opening through the intermediate passivation sub-layer.

25. The semiconductor device of claim 18, wherein the conductive field plate contacts sidewalls of the upper passivation sub-layer.

26. The semiconductor device of claim 18, wherein the upper and intermediate passivation sub-layers are present on a source-side and a drain-side of the gate electrode.

* * * * *